(12) United States Patent
Karhade et al.

(10) Patent No.: US 12,181,710 B2
(45) Date of Patent: Dec. 31, 2024

(54) PHOTONIC INTEGRATED CIRCUIT PACKAGING ARCHITECTURE

(71) Applicant: Intel Corporation, Santa Clara, CA (US)

(72) Inventors: Omkar G. Karhade, Chandler, AZ (US); Xiaoqian Li, Chandler, AZ (US); Tarek A. Ibrahim, Mesa, AZ (US); Ravindranath Vithal Mahajan, Chandler, AZ (US); Nitin A. Deshpande, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 742 days.

(21) Appl. No.: 17/237,375

(22) Filed: Apr. 22, 2021

(65) Prior Publication Data
US 2022/0342150 A1 Oct. 27, 2022

(51) Int. Cl.
*G02B 6/122* (2006.01)
*G02B 6/12* (2006.01)

(52) U.S. Cl.
CPC ....... *G02B 6/1225* (2013.01); *G02B 6/12002* (2013.01); *G02B 2006/1213* (2013.01); *G02B 2006/12176* (2013.01)

(58) Field of Classification Search
None
See application file for complete search history.

(56) References Cited

U.S. PATENT DOCUMENTS

| | | | |
|---|---|---|---|
| 2015/0295098 A1* | 10/2015 | Toda | H01L 31/02005 257/82 |
| 2017/0108655 A1* | 4/2017 | Zarbock | G02B 6/4238 |
| 2018/0348434 A1* | 12/2018 | Yim | H01L 24/97 |
| 2019/0137706 A1 | 5/2019 | Xie | |
| 2019/0172821 A1 | 6/2019 | Yim | |
| 2020/0411333 A1 | 12/2020 | Yu et al. | |
| 2023/0087809 A1* | 3/2023 | Li | G02B 6/32 385/33 |

OTHER PUBLICATIONS

International Search Report and Written Opinion in International Patent Application No. PCT/US2022/021314 dated Jul. 8, 2022, 13 pages.

* cited by examiner

*Primary Examiner* — Jerry Rahll
(74) *Attorney, Agent, or Firm* — Akona IP PC

(57) ABSTRACT

Photonic packages and device assemblies that include photonic integrated circuits (PICs) coupled to optical lenses on lateral sides of the PICs. An example photonic package comprises a package support, an integrated circuit (IC), an insulating material, a PIC having an active side and a lateral side substantially perpendicular to the active side. At least one optical structure is on the active side. A substantial portion of the active side is in contact with the insulating material, and the PIC is electrically coupled to the package support and to the IC. The photonic package further includes an optical lens coupled to the PIC on the lateral side. In some embodiments, the photonic package further includes an interposer between the PIC or the IC and the package support.

20 Claims, 15 Drawing Sheets

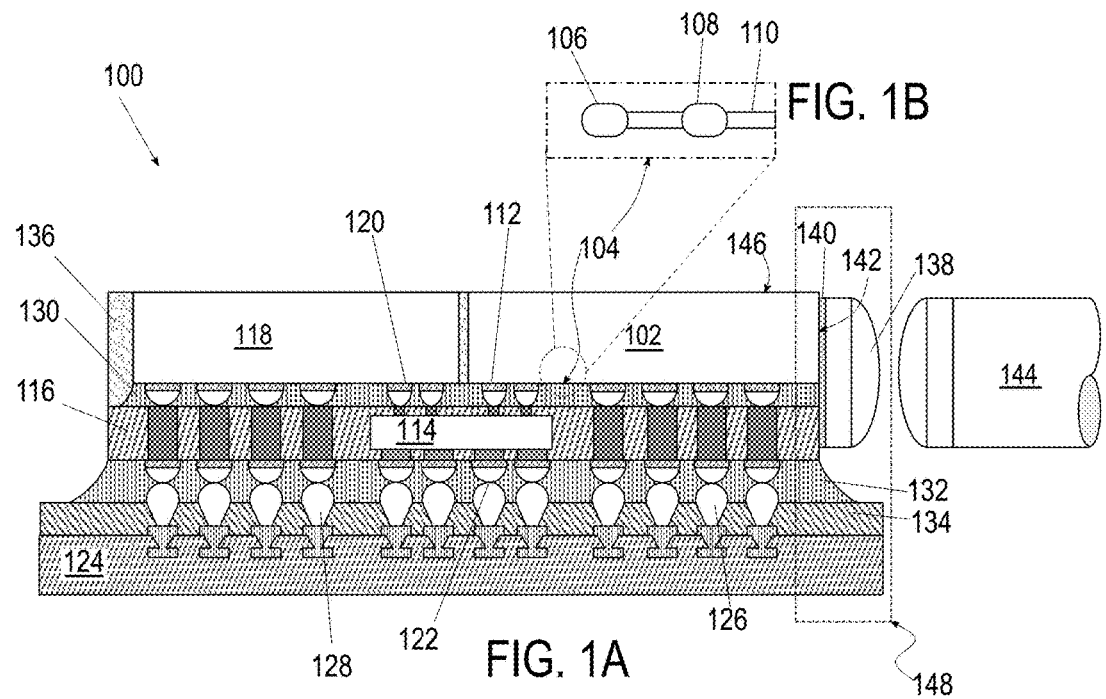
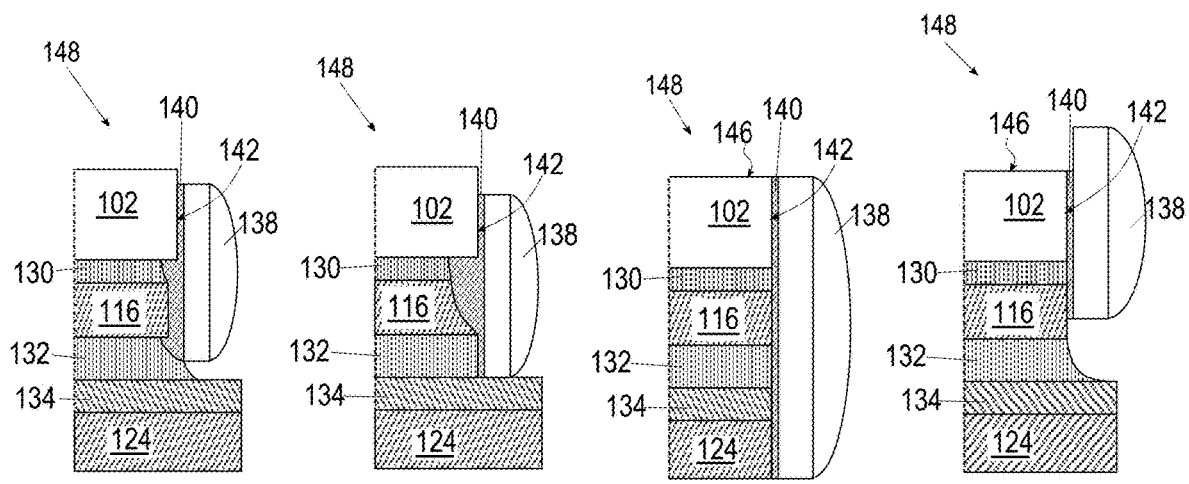

PHOTONIC INTEGRATED CIRCUIT PACKAGING ARCHITECTURE

TECHNICAL FIELD

The present disclosure relates to packaging photonic integrated circuits (PICs). More specifically, it relates to techniques, methods, and apparatus directed to PIC packaging architecture.

BACKGROUND

Contemporary optical communications and other systems often employ PICs. Smaller, faster, and less expensive optical components can enable universal, low-cost, high-volume optical communications needed for fast and efficient communication technologies demanded by high volume internet data traffic. In optical communications, information is transmitted by way of an optical carrier whose frequency typically is in the visible or near-infrared region of the electromagnetic spectrum. A carrier with such a high frequency is sometimes referred to as an optical signal, an optical carrier, a light wave signal, or simply light. A typical optical communications network includes several optical fibers, each of which may include several channels. A channel is a specified frequency band of an electromagnetic signal and is sometimes referred to as a wavelength. Technological advances today enable implementing portions of optical communication systems at the integrated circuit (IC) (or chip or die) level in PICs. Packaging such PICs presents many challenges.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1A is a schematic cross-sectional view of an example photonic packaging architecture, according to some embodiments of the present disclosure.

FIG. 1B is a schematic illustration of an example detail of a photonic package, according to some embodiments of the present disclosure.

FIGS. 1C-1F are schematic cross-sectional views of example details of a photonic package according to various embodiments of the present disclosure.

DETAILED DESCRIPTION

Overview

Figure 2:
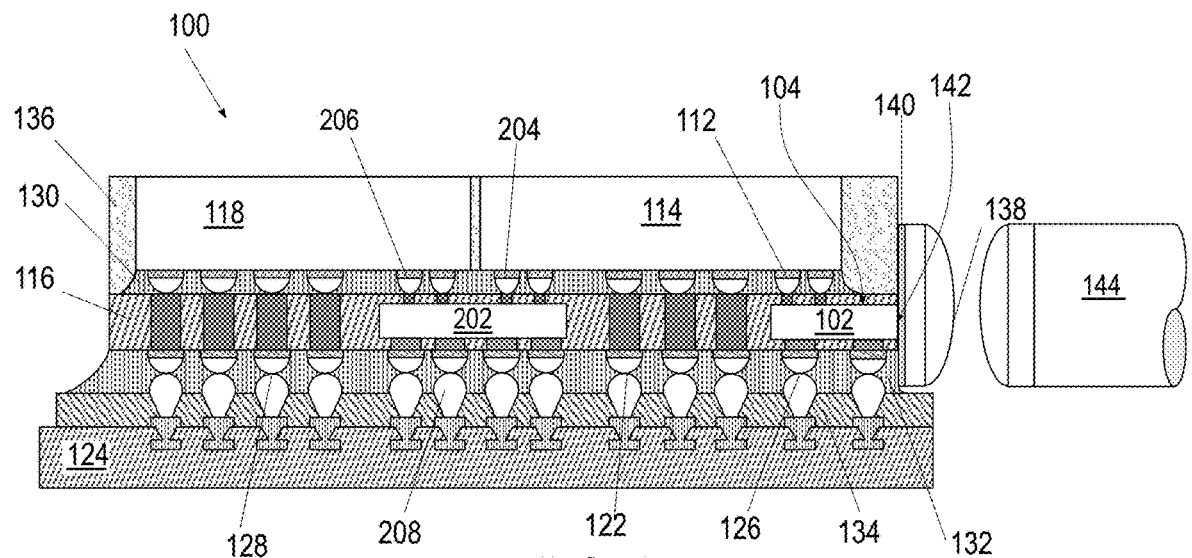
FIG. 2 is a schematic cross-sectional view of another example photonic packaging architecture, according to some embodiments of the present disclosure.

For purposes of illustrating photonic packages described herein, it is important to understand phenomena that may come into play during packaging of PICs. The following foundational information may be viewed as a basis from which the present disclosure may be properly explained. Such information is offered for purposes of explanation only and, accordingly, should not be construed in any way to limit the broad scope of the present disclosure and its potential applications.

In a general sense, a PIC integrates photonic functions for information signals imposed on electromagnetic waves, e.g., electromagnetic waves of optical wavelengths. PICs find application in fiber-optic communication, medical, security, sensing, and photonic computing systems. The PIC may implement one or more optical and electro-optical devices such as lasers, photodetectors, waveguides, and modulators on a single semiconductor chip. In addition, the PIC may also include electrical circuitry to process electrical signals corresponding to these optical signals. Such integrated PICs can enable a cost-effective solution for optical communication and optical interconnects.

Packaging the PIC is not trivial. Among the challenges is a need for parallel tight-pitch interconnects that enable high density, high bandwidth electrical communication between the PIC and other electrical devices, such as processing units (XPU) and electronic integrated circuits (EIC) with simultaneous optical access to the PIC for the optical signals. Indeed, getting optical signals into and out of PICs is a driver of manufacturing cost and complexity. In addition, coupling a fiber-optic cable, also sometimes referred to as "optical fiber" or, simply, a "fiber," to a PIC so that electromagnetic signals, e.g., optical signals, may exchange between the two is challenging, One way to couple a PIC to a fiber is to implement edge-coupling by using an intermediate optical coupling structure (OCS) (sometimes referred to as "fiber assembly unit" (FAU)) that has one end coupled to a fiber and an opposite end placed proximate to a PIC die (i.e., a die that houses one or more PICs) so that electromagnetic signals may be exchanged between the PICs of the PIC die and the fiber, via the OCS.

However, because the signals require a transparent medium for propagation, the PIC must be typically exposed in the package to allow the fiber to be coupled to the PIC with sufficient stability even in such edge-coupled assemblies. For example, in some packaging architectures, the PIC has an overhang to couple to the fiber which presents at the edge of the package. In another example, the PIC is located in a cavity so that it is exposed, and the fiber, which presents at the package edge, is coupled to the exposed face. Both these architectures cannot support small footprint PICs because a substantial area of the PIC having functional structures and circuitry is used up in coupling to the fiber. They are also limited in the density of their electrical interconnects to other ICs in the package.

In one aspect of the present disclosure, an example of a photonic packaging architecture includes a photonic package that comprises a package support, an IC, an insulating material, a PIC having an active side and a lateral side substantially perpendicular to the active side, and an optical lens coupled to the PIC on the lateral side. The PIC includes at least one optical structure on the active side. A substantial portion of the active side of the PIC is in contact with the insulating material, and the PIC is electrically coupled to the package support and to the IC.

As used herein, a portion of the active side of the PIC may be described as "substantial" if it is larger than about 90% of the total surface area of the active side of the PIC.

As used herein, the term "insulating material" refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

As used herein, the term "optical structure" includes arrangements of forms fabricated in ICs to receive, transform and/or transmit optical signals as described herein. It may include optical conductors such as waveguides, electromagnetic radiation sources such as lasers, and electro-optical devices such as photodetectors.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices. The term "circuit" means one or more passive and/or active components that are arranged to cooperate with one another to provide a desired function. The terms "substantially," "close," "approximately," "near," and "about," generally refer to being within +/−20% of a target value (e.g., within +/−5 or 10% of a target value) based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers. In addition, the term "dispose" as used herein refers to position, location, placement, and/or arrangement rather than to any particular method of formation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. When used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

In the drawings, a particular number and arrangement of structures and components are presented for illustrative purposes and any desired number or arrangement of such structures and components may be present in various embodiments. Further, the structures shown in the figures may take any suitable form or shape according to material properties, fabrication processes, and operating conditions.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1A is a schematic cross-sectional illustration of a photonic package 100, according to some embodiments of the present disclosure. As shown, photonic package 100 may include a PIC 102, with an active side 104. Example optical structures over a portion of active side 104 are shown in more detail in FIG. 1B. FIG. 1B is a schematic of a face of active side 104 (for example, looking up at active side 104 from underneath PIC 102). Example optical structures include an electromagnetic radiation source 106, an electro-optical device 108, and a waveguide 110 on active side 104. In many embodiments, the optical structures may be fabricated on active side 104 using any known method in the art, including semiconductor photolithographic and deposition methods. In some embodiments, the optical structures may extend substantially across an entire area of active side 104. In some other embodiments, the optical structures may be confined within a portion of active side 104.

Electromagnetic radiation source 106 can enable generating optical signals and may include lasers, for example if PIC 102 supports wavelengths between about 0.8 and 1.7 micrometer; or oscillators, for example, if PIC 102 supports wavelengths on a millimeter scale; or some combination of lasers and oscillators, for example, if PIC 102 supports wavelengths between 0.8 micrometer and millimeter or centimeter. Electro-optical device 108 can enable receiving, transforming, and transmitting optical signals. In some embodiments, electro-optical device 108 may be any device or component configured to encode information in/on to the electromagnetic signals, such as modulator, polarizer, phase shifter, and photodetector.

Waveguide 110 can guide optical signals and also perform coupling, switching, splitting, multiplexing and demultiplexing optical signals. In some embodiments, waveguide 110 may include any component configured to feed, or launch, the electromagnetic signal into the medium of propagation such as an optical fiber. In some embodiments, waveguide 110 may further be configured as optical multiplexers and/or demultiplexers, for example, to perform a frequency division multiplexing (FDM) or wavelength division multiplexing (WDM). In some embodiments, waveguide 110 may include a de-multiplexer, such as Arrayed Waveguide Grating (AWG) de-multiplexer, an Echelle grating, a single-mode waveguide, or a thin film filter (TFF) de-multiplexer.

Waveguide 110 may comprise planar and non-planar waveguides of any type. In one example, waveguide 110 may comprise a silicon photonic waveguide based on silicon-on-isolator (SOI) platform, configured to guide electromagnetic radiation of any wavelength bands from about 0.8 micrometer to about 5 centimeter. In another example, waveguide 110 may support wavelengths from about 1.2 micrometer to about 1.7 micrometer in the near infrared and infrared bands for use in data communications and telecommunications. In another example, waveguide 110 may support wavelengths from about 1 millimeter to about 10 millimeter extremely high frequency (EHF) band of radio/micro-waves), and in particular, wavelengths of about 2 millimeter may be used for radar and radio frequency (RF) wireless communications.

Although only three such example optical structures are illustrated, it may be understood that PIC 102 may include more optical structures of the same or different types that enable it to function appropriately as a photonic device receiving, transforming, and transmitting optical and electrical signals.

In some embodiments, the optical structures on active side 104 may be covered with a protective layer (not shown) of suitable material, such as optical epoxy. The protective layer enables maintaining integrity of the optical structures during fabrication processes to which PIC 102 may be subjected, for example, attaching, solder reflowing, grinding, polishing, underfilling, and molding. The protective layer may ensure, for example, that optical transmission properties of the optical structures are not compromised during the fabrication processes by contamination with mold or underfill material, or that optical functionality is not compromised by tearing, breaking, or other destructive events during the fabrication processes. The protective layer may also serve to avoid leaking optical signals from the optical structures, including waveguide 110, during operation of PIC 102.

In general, the light provided to PIC 102 may include any electromagnetic signals having information encoded therein (or, phrased differently, any electromagnetic signals modulated to include information). Often times, the electromagnetic signals are signals associated with optical amplitudes, phases, and wavelengths and, therefore, descriptions provided herein refer to "optical" signals (or light) and "optical" components (e.g., "electro-optical device 108"). However, photonic package 100 with PIC 102, as described herein, are not limited to operating with electromagnetic signals of optical spectrum and descriptions provided herein with reference to optical signals and/or optical components are equally applicable to electromagnetic signals of any suitable wavelength, such as electromagnetic signals in near-infrared (NIR) and/or infrared (IR) bands, as well as electromagnetic signals in the RF and/or microwave bands.

PIC 102 may comprise a semiconductor material including, for example, N-type or P-type materials. PIC 102 may include, for example, a crystalline substrate formed using a bulk silicon (or other bulk semiconductor material) or a SOI structure (or, in general, a semiconductor-on-insulator structure). In some embodiments, PIC 102 may be formed using alternative materials, which may or may not be combined with silicon, that include, but are not limited to, lithium niobite, indium phosphide, silicon dioxide, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. In some embodiments, PIC 102 may comprise a non-crystalline material, such as polymers. In some embodiments, PIC 102 may be formed on a printed circuit board (PCB). In some embodiments, PIC 102 may be inhomogeneous, including a carrier material (such as glass or silicon carbide) as a substrate with a thin semiconductor layer over which is active side 104. Although a few examples of the material for PIC 102 are described here, any material or structure that may serve as a foundation upon which PIC 102 may be built falls within the spirit and scope of the present disclosure.

Turning back to FIG. 1A, PIC 102 may be electrically coupled by way of interconnects 112 to an EIC 114 situated in an interposer 116. Interconnects 112 may comprise die-to-die (DTD) interconnects along with associated conductive traces, planes, vias, and pads enabling electrical coupling between PIC 102 and EIC 114. Note that some component parts of interconnects are shown in FIG. 1A but are not labeled separately so as not to clutter the drawing. In some embodiments, interconnects 112 may comprise flip-chip interconnects that enable photonic package 100 to achieve a smaller footprint and higher die-to-package-package support connection density than could be achieved using conventional wire-bond techniques, in which conductive contacts between PIC 102 and EIC 114 are constrained to be located on a periphery of PIC 102 and/or EIC 114. For example, PIC 102 having a square shape with side length N may be able to form 4N wire-bond interconnects, versus $N^2$ flip-chip interconnects utilizing the entire "full field" surface area of PIC 102. Implementing interconnects 112 in a high-density configuration may enable photonic package 100 to have much lower parasitic inductance relative to using wire-bonds, which may result in improved signal integrity for high-speed signals between PIC 102 and EIC 114.

In addition, by co-packaging PIC 102 with EIC 114 using interconnects 112 in a high-density configuration, input/output power can be reduced by limiting electrical signaling to intra-package distances while also reducing cost and signal loss (among other advantages). The three-dimensional (3D) stacked architecture can lower power requirements for data transfer, for example, to 2-3 picoJoules/bit. The high-density configuration can also enable serialization of electromagnetic signals in PIC 102, further allowing fewer number of electrical interconnects with EIC 114. In some example embodiments, interconnects 112 may be formed with a high-density pitch between 18 and 36 micrometer. In an example embodiment, interconnects 112 may be formed with a high-density pitch of 25 micrometer.

In some embodiments, EIC 114 may comprise an IC configured to electrically integrate with PIC 102 to achieve an intended functionality of photonic package 100. For example, EIC 114 may be an Application Specific IC (ASIC), such as a switch circuit or driver/receiver circuit used in optical communication systems. In some embodiments, EIC 114 may comprise a bridge circuit, for example, including an embedded multi-die interconnect bridge having appropriate circuitry on/in a semiconductor substrate to connect at silicon-interconnect speeds with a small footprint as part of an Omni-Directional Interface (ODI) architecture, for example, of 2.5D packages. In some embodiments, EIC 114 may comprise active components, including one or more transistors, voltage converters, trans-impedance amplifiers (TIA), clock and data recovery (CDR) components, microcontrollers, etc. In some embodiments, EIC 114 may comprise passive circuitry sufficient to enable interconnection to PIC 112 and other components in photonic package 100 without any active components. In some embodiments, EIC 114 may extend under a substantial area of PIC 102; in other embodiments, EIC 114 may overlap with PIC 102 along one or more edges. In various embodiments, EIC 114 and PIC 102 may overlap sufficiently to enable disposing interconnects 112 with a desired pitch and number of interconnections that enable photonic package 100 to function appropriately.

In various embodiments, interposer 116 may comprise any suitable insulating material, such as an organic material, for example, a polymer with fillers. In some embodiments, interposer 116 may be formed of a single layer with metallization circuitry on top and bottom surfaces; in other embodiments, interposer 116 may comprise a plurality of layers with metallization circuitry between layers. The 3D architecture as illustrated can allow a smaller footprint overall for photonic package 100.

Interconnects 120 may provide electrical coupling between EIC 114 and an XPU 118. Interconnects 120 may comprise DTD interconnects along with associated conductive traces, planes, and pads enabling electrical coupling between PIC 102 and EIC 114. XPU 118 may comprise any suitable integrated chip with processing functionality, such as Central Processing Unit (CPU), Graphics Processing Unit (GPU), Field-Programmable Gate Array (FPGA), ASIC, and accelerator. In various embodiments, XPU 118 may be, or include, one or more voltage converters, TIA, CDR components, microcontrollers, etc. In some embodiments, interconnects 120 may comprise high-density flip-chip interconnects.

Interconnects 122 comprising die-to-package-substrate (DTPS) interconnects, and associated conductive traces, planes, vias, and pads may provide electrical coupling between EIC 114 and a package support 124. In various embodiments, package support 124 may comprise a single or multi-layered insulating material with metallization including planes, traces, vias, and passive components (e.g., inductors, capacitors) within the insulating material and/or on the surfaces. Package support 124 may comprise ceramic (e.g., alumina) and/or organic material (e.g., epoxy based FR4, resin based bismaleimide triazine (BT), or polyimide) and may be formed in various varieties including rigid and tape. Package support 124 may provide mechanical base support and appropriate interfaces to access components in photonic package 100 electrically and optically. Interconnects 126 comprising DTPS interconnects, and associated conductive traces, planes, vias and pads may provide electrical coupling between PIC 102 and package support 124. Likewise, interconnects 128 comprising DTPS interconnects, and associated conductive traces, planes, vias and pads may provide electrical coupling between XPU 118 and package support 124.

Interconnects 122, 126, and 128 may comprise any suitable interconnection, including flip-chips and ball-grid array (BGA) with corresponding metallization, pads and vias, including through-substrate-vias (TSVs) through EIC 114 or through-hole vias also called through-mold-vias (TMVs) through interposer 116. Note that the shapes of various interconnects shown in the figure are merely for illustrative purposes and are not to be construed as limitations. The shapes of interconnects 112, 120, 122, 126, and/or 128 for example, may result from natural processes occurring during solder reflow. The shapes may depend on material viscosity in liquid state, temperatures of processing, surface tension forces, capillary action, and other mechanisms beyond the scope of the present disclosure. Interconnects 112, 120, 122, 126, and 128 can enable a stacked ODI architecture that enables low power, low loss, high-speed electrical signals between PIC 102, EIC 114, and XPU 118. Such ODI architecture allows for top-packaged chips (e.g., PIC 102, EIC 114 and XPU 118) to communicate with each other horizontally or vertically, permitting smaller footprint, higher speeds, and reduced power usage for photonic package 100.

Underfill 130 (also referred to as "first-level underfill" or "underfill of a first-level") may be between interposer 116 and XPU 118 and PIC 102. Another underfill 132 (also referred to as "second-level underfill" or "underfill of a second-level") and solder resist 134 (e.g., organic polymer material such as benzotriazole, imidazole, polyimide, or epoxy) may be between package support 124 and interposer 116. In various embodiments, first-level underfill 130 and second-level underfill 132 may comprise the same or different insulating materials. In some embodiments, first-level underfill 130 and second-level underfill 132 may comprise thermoset epoxies with silicon oxide particles; in some embodiments, first-level underfill 130 and second-level underfill 132 may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations. In some embodiments, solder resist 132 may be a liquid or dry film material including photo-imagable polymers. In some embodiments, solder resist 132 may be non-photo-imagable.

XPU 118 and PIC 102 may be encased by a mold 136. In some embodiments, mold 136 may extend to the surfaces of XPU 118 and PIC 102 distant from interposer 116 without overlapping on such surfaces, thereby exposing XPU 118 and PIC 102 for direct connection of heat sinks, identifying markers, etc. In some embodiments, mold 136 may cover the surfaces of XPU 118 and PIC 102 distant from interposer 116.

Although not specifically shown in all of the present illustrations in order to not clutter the drawings, when DTD or DTPS interconnects are described, a surface of a first IC (including PICs) may include a first set of conductive contacts, and a surface of a second IC (including PICs) or a package support may include a second set of conductive contacts. One or more conductive contacts of the first set may then be electrically and mechanically coupled to some of the conductive contacts of the second set by the DTD or DTPS interconnects. In some embodiments, the pitch of the DTD interconnects may be different from the pitch of the DTPS interconnects, although, in other embodiments, these pitches may be substantially the same. In some embodiments, the DTPS interconnects disclosed herein may have a pitch between about 80 micrometer and 300 micrometer, while the DTD interconnects disclosed herein may have a pitch between about 7 micrometer and 100 micrometer. In an example embodiment, some DTD interconnects have a pitch of 25 micrometer.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some embodiments, a thin cap of solder may be used in a metal-to-metal interconnect to accommodate planarity, and this solder may become an intermetallic compound during processing. In some metal-to-metal interconnects that utilize hybrid bonding, a dielectric material (e.g., silicon oxide, silicon nitride, silicon carbide, or an organic layer) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-tocopper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the ICs on either side of a set of DTD interconnects may be unpackaged dies, and/or the DTD interconnects may include small conductive bumps or pillars (e.g., copper bumps or pillars) attached to the respective conductive contacts by solder. In some embodiments, some or all of the DTD interconnects may be solder interconnects that include a solder with a higher melting point than a solder included in some or all of the DTPS interconnects. For example, when the DTD interconnects are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth) or tin, silver, and bismuth. In some embodiments, a lower-temperature solder may include indium, indium and tin, or gallium.

In some embodiments, a set of DTD interconnects may include solder. DTD interconnects that include solder may include any appropriate solder material, such as any of the materials discussed above for the DTPS interconnects. In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In photonic packages as described herein, some or all of the DTD interconnects may have a finer pitch than the DTPS interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die (or PIC) and a package support on either side of a set of DTPS interconnects. In particular, the differences in the material composition of ICs and package supports may result in differential expansion and contraction of the ICs and package supports due to heat generated during operation (as well as the heat applied during various manufacturing operations). To mitigate damage caused by this differential expansion and contraction (e.g., cracking, solder bridging, etc.), the DTPS interconnects in any of the photonic packages as described herein may be formed larger and farther apart than DTD interconnects, which may experience less thermal stress due to the greater material similarity of the pair of dies on either side of the DTD interconnects.

PIC 102 may be optically coupled to an optical lens 138 using any suitable attachment means, for example, optical glue 140, on at least a portion of a lateral side 142 of PIC 102. In various embodiments, one or more waveguide 110 of PIC 102 may be exposed on lateral side 142 enabling optical coupling to optical lens 138. Optical lens 138 may be of any type, including lensed fiber (lens integrated with optical fiber), polymer micro lens, prism lens, graded refractive-index (GRIN) lens or any other suitable lens that can serve as an optical coupler between waveguide 110 and an optical fiber 144. Optical fiber 144 may facilitate optical coupling to other parts of a system. In some embodiments wherein PIC 102 comprises V-grooves monolithically integrated therein on active side 104 and exposed along lateral side 142, optical lens 138 may comprise optical fiber arrays coupled to PIC 102 along the exposed V-grooves, for example, self-aligned along the corresponding V-grooves. In a general sense, V-grooves comprise inverted tapers (grooves) pressed or etched into a substrate such as silicon. In various embodiments, optical lens 138 may comprise an array of multiple such optical lens situated proximate to lateral side 142. In an example embodiment, the array may comprise 12 to 20 such lens.

In some embodiments, optical lens 138 may be flush with a top surface 146 of PIC 102 opposite to active side 104. In some other embodiments (e.g., as shown in FIG. 1A), optical lens 138 may not be flush with top surface 146. In such embodiments, an internal heat sink (not shown) may be attached on top surface 146 without butting into optical lens 138. In a general sense, thermal management of photonic package 100 may be achieved by attaching the internal heat sink to top surface 146 of PIC 102. Heat transfer from EIC 114 may follow a thermal path laterally through interposer 116, or vertically through first-level interconnects 112, PIC 102, and the internal heat sink. In yet other embodiments, optical lens 138 may protrude beyond top surface 146; in such embodiments, the heat sink may be provided with a suitable cutout that accommodates the protrusion.

Optical glue 140 may comprise any suitable material that can permit optical signals to pass through while serving to adhere optical lens 138 to PIC 102. The materials can include, by way of examples, and not as limitations, ultra-violet curing optical adhesives, epoxies, silicone, modified silane, and acrylates. Lateral side 142 may be ground and polished to suitable surface quality enabling optical interconnection with no substantial loss in optical signal integrity across boundaries of PIC 102 and optical lens 138.

In various embodiments, optical glue 140 may be disposed proximate to lateral side 142 of PIC 102. Note that a shape of optical glue 140 may vary from that shown in the figure, depending on various factors, such as the material used, its viscosity, manner of deposition, curing or other fabrication processes, and post-processing operations. For example, optical glue 140 may extrude into a volume underneath PIC 102 or interposer 116. In some embodiments, optical glue 140 may extend past lateral side 142 of PIC 102, for example, onto lateral sides of first-level underfill 130 and interposer 116. To explain such variation in more detail, a portion 148 of photonic package 100 is shown in in FIGS. 1C-1F for illustrative purposes.

In some embodiments as shown in FIG. 1C, a size or a position of optical lens 138 may be such that its lower end overhangs beyond interposer 116. In the example embodiment shown in FIG. 1C, optical glue 140 may extrude under PIC 102 according to a fabrication process that uses sacrificial material to form hollow spaces into which optical glue 140 can flow before it solidifies. The shape of the extrusion can vary with the spaces, which in turn can vary according to the process used to deposit and later remove the sacrificial material. Optical glue 140 may also extrude under interposer 116, for example, depending on a volume of material dispensed, or an overhang of optical lens 138 beyond an edge of interposer 116. Second-level underfill 132 may extrude from beneath optical lens 138 in a fillet. In some embodiments in which optical lens 138 is attached after second-level underfill 132 is already in place, optical glue 140 may not extrude beneath interposer 116.

In an example embodiment as shown in FIG. 1D, the size or position of optical lens 138 may be such that its lower end extends down to solder resist 134 on package support 124. In some embodiments in which solder resist 134 may be absent (not shown), optical lens 138 may extend down to a top surface of package support 124. In the example embodiment shown in FIG. 1D, optical glue 140 extrudes under PIC 102 in a shape that is different from that shown in FIG. 1C merely for illustrative purposes. Optical glue 140 can take any appropriate shape depending various factors as discussed above.

In yet another example embodiment as shown in FIG. 1E, the size of optical lens 138 may be such that it extends from top surface 146 of PIC 102 to a bottom surface of package support 124. The placement and size of optical lens 138 may be based on factors beyond the scope of the present disclosure.

In yet another example embodiment as shown in FIG. 1F, optical lens 138 may protrude beyond top surface 146 of PIC 102. In such embodiments, any heat sink (not shown) attached to top surface 146 of PIC 102 may be provided with a suitable cutout to accommodate the protrusion of optical lens 138 beyond top surface 146. As suggested by the example architectures of FIGS. 1C-1F, photonic package 100 may be configurable according to the placement and size of optical lens 138 without significant loss of optical or electrical functionality.

In various embodiments, extending an area of adhesion with optical glue 140 beyond lateral side 142 of PIC 102 may allow for increased attachment stability and overall physical integrity of photonic package 100. In some embodiments, the larger adhesive area may permit decreasing a thickness of PIC 102, for example, to allow an overall smaller size for photonic package 100. In some embodiments, PIC 102 may be 100 micrometer thick. In some embodiments, EIC 114 may be 50 to 60 micrometer thick.

Lateral attachment of optical lens 138 to PIC 102 can enable relaxed alignment and placement of photonic package 100 in the system as compared to an open attachment mode in which the package needs an appropriate cutout to allow the optical fiber to be optically coupled to the PIC, increasing manufacturing and assembly complexity. Various embodiments of photonic package 100 can enable decreased manufacturing costs, for example, by permitting easy pick-and-place of optical lens 138 onto lateral side 142 of PIC 102. photonic package 100 can also be optically coupled to other parts of the system along its peripheral lateral sides, without any need for additional cutouts or other complicated shapes and/or configurations, allowing for ease of assembly. Further, the 3D stacked architecture without cutouts enables active side 104 of PIC 102 to be unexposed and thereby protected from external debris, contaminants, scratches, or other issues that could potentially degrade optical signal integrity. In some embodiments, a substantial portion of active side 104 of PIC 102 may be in contact with an insulating material, such as first-level underfill 130.

Various conductive contacts used in photonic package 100, for example, conductive contacts that form part of interconnects 112, 120, 122, 126 and 128, may include multiple layers of material that may be selected to serve different purposes. In some embodiments, the conductive contacts may be formed of aluminum, and may include a layer of gold (e.g., with a thickness of less than 1 micrometer) between the aluminum and adjacent interconnects to limit surface oxidation of the contacts and improve adhesion with adjacent contacts. Alternate materials for the surface finish include palladium, platinum, silver, and tin. In some embodiments, the conductive contacts may be formed of aluminum, and may include a layer of a barrier metal such as nickel, as well as a layer of gold, or other appropriate material, wherein the layer of barrier metal is disposed between aluminum and gold, and the layer of gold is disposed between the barrier metal and the adjacent interconnect. In such embodiments, the gold, or other surface finish, may protect the barrier metal surface from oxidation before assembly, and the barrier metal may limit diffusion of solder from the adjacent interconnects into aluminum. In many embodiments, surfaces of PIC 102, EIC 114 and XPU 118 in contact with solder may be covered by a suitable solder mask material (not shown) that prevents solder from melting and bridging adjacent contacts during solder reflow.

In various embodiments, more or fewer elements described above may be included in photonic package 100, compared to what is shown in FIG. 1A. In some embodiments, conductive metallization lines and optical structures may extend into and out of the plane of the drawing, providing conductive pathways to route electrical and/or optical signals to and/or from various elements in photonic package 100. The conductive vias and/or lines that provide conductive pathways in/on the photonic package 100 may be formed using any suitable techniques. Examples of such techniques may include subtractive fabrication techniques, additive or semi-additive fabrication techniques, single Damascene fabrication techniques, dual Damascene fabrication techniques, or any other suitable techniques. In some embodiments, layers of insulator material, such as oxide material or nitride material, may insulate various structures in the conductive pathways from proximate structures, and/or may serve as etch stops during fabrication. In some embodiments, additional layers, such as diffusion barrier layers or/and adhesion layers may be disposed between conductive material and proximate insulating material. Diffusion barrier layers may reduce diffusion of the conductive material into the insulating material. Adhesion layers may improve mechanical adhesion between the conductive material and the insulating material.

Note that in the figure, interconnects 112, 120, 122, 126 and 128 are shown aligned with vias merely for illustrative purposes. In various embodiments, appropriate conductive traces may allow for some interconnects, such as solder balls, to be located away from vias and vice versa. In some embodiments, a redistribution layer comprising at least one layer of an insulating material and metallization on PIC 102, EIC 114 and/or XPU 118 may enable any desired placement of solder balls with respect to vias and other circuitry. In a general sense, interconnect structures may be arranged within photonic package 100 to route electrical signals according to a wide variety of designs. During operation of photonic package 100, electrical signals (such as power, input/output (I/O) signals, including various control signals for external and internal control of PIC 102) may be routed to and/or from PIC 102 through the conductive contacts and conductive pathways of photonic package 100.

FIG. 2 is a schematic cross-sectional illustration of a photonic package 100, according to some embodiments of the present disclosure. Descriptions of photonic package 100 provided with reference to FIG. 1A are applicable to photonic package 100 shown in FIG. 2 and, therefore, in the interests of brevity, are not repeated. Instead, only additional features or differences are described.

Photonic package 100 includes PIC 102 with active side 104 situated in interposer 116. In various embodiments, a substantial portion of active side 104 is in contact with an insulating material comprising interposer 116. Optical structures on active side 104 of PIC 102 may be protected with a layer of protective coating (not shown) such that they are not contaminated during fabrication or post processing operations. PIC 102 may be electrically coupled to EIC 114 with interconnects 112. A heat sink (not shown) may be disposed over an exposed upper surface of EIC 114 for suitable heat transfer and cooling. Heat transfer from PIC 102 may be achieved laterally through interposer 116, and/or vertically with interconnects 112 and EIC 114 to the heat sink.

EIC 114 may be electrically coupled to XPU 118 through an intermediate bridge IC 202 and interconnects 204. In various embodiments, bridge IC 202 may comprise appropriate circuitry on/in a semiconductor substrate to connect at silicon-interconnect speeds with a small footprint. In some embodiments, bridge IC 202 may comprise active components, such as transistors and diodes in addition to bridge circuitry including metallization traces, vias and passive components for enabling electrical coupling between two ICs; in other embodiments, bridge IC 202 may include bridge circuitry including metallization traces, vias and passive components for enabling electrical coupling between two ICs, and may not include active components. Interconnects 204 and 206 may comprise high-density, tight-pitch DTD interconnects along with associated conductive traces, planes, vias and pads.

In various embodiments, PIC 102 may be electrically coupled to package support 124 with interconnects 126. Bridge IC 202 may likewise be electrically coupled to package support 124 with interconnects 208. EIC 114 may be electrically coupled to package support 124 with interconnects 122. XPU 118 may be electrically coupled to package support 124 with interconnects 208 including TMVs in interposer 116.

First-level underfill 130 may be between interposer 116 and XPU 118 and EIC 114. Second-level underfill 132 may be between interposer 116 and package support 124. Solder resist 230 may be over a surface of package support 124 proximate to interconnects 122, 126, 128, and 208. Mold 136 may be over and around the components, for example, to provide protection and mechanical stability.

PIC 102 may be optically coupled to optical lens 138 using any suitable attachment means, for example, optical glue 140, on at least a portion of lateral side 142 of PIC 102. In various embodiments, one or more waveguide 110 of PIC 102 may be exposed on lateral side 142 enabling optical coupling to optical lens 138. Optical fiber 144 may provide optical coupling to photonic package 100 with other parts of a system. In various embodiments, optical glue 140 may extend past lateral side 142 of PIC 102 onto lateral sides of mold 136, first-level underfill 130 and/or interposer 116, for example as indicated in FIGS. 1C-1E, to enable various positioning and sizes of optical lens 138.

Figure 3:
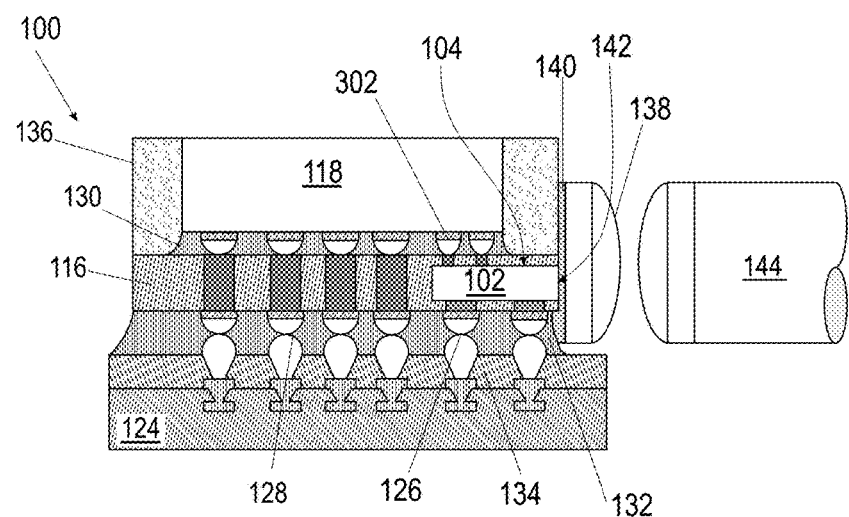
FIG. 3 is a schematic cross-sectional view of yet another example photonic packaging architecture, according to some embodiments of the present disclosure.

FIG. 3 is a schematic cross-sectional illustration of a photonic package 100, according to some embodiments of the present disclosure. Descriptions of photonic package 100 provided with reference to FIG. 1A are applicable to photonic package 100 shown in FIG. 3 and, therefore, in the interests of brevity, are not repeated. Instead, only additional features or differences are described.

Photonic package 100 includes PIC 102 with active side 104 situated in interposer 116. In various embodiments, a substantial portion of active side 104 is in contact with an insulating material comprising interposer 116. PIC 102 may be electrically coupled to XPU 118 with interconnects 302. In various embodiments, XPU 118 and/or PIC 102 may include electrical components and circuitry that are equivalents of EIC 114 to allow suitable functionality of PIC 102 in photonic package 100. In other embodiments, PIC 102 and XPU 118 may function suitably without the need for EIC 114 or its equivalents. A heat sink (not shown) may be disposed over an exposed upper surface of XPU 118 for suitable heat transfer and cooling. Heat transfer from PIC 112 may be achieved laterally through interposer 116, and/or vertically with interconnects 302 and XPU 118 to the heat sink. In various embodiments, interconnects 302 may comprise high-density, tight-pitch DTD interconnects and associated conductive traces, planes, vias, and pads.

In various embodiments, PIC 102 may be electrically coupled to package support 124 with interconnects 126. XPU 118 may be coupled to package support 124 with interconnects 128. First-level underfill 130 may be between interposer 116 and XPU 118. Second-level underfill 132 may be between interposer 116 and package support 124. Solder resist 134 may be over the surface of package support 124 proximate to interconnects 126 and 128. Mold 136 may be over and around the components, for example, to provide protection and mechanical stability.

PIC 102 may be optically coupled to optical lens 138 using any suitable attachment means, for example, optical glue 140, on at least a portion of lateral side 142 of PIC 102. In various embodiments, one or more waveguides of PIC 102 may be exposed on lateral side 142 enabling optical coupling to optical lens 138. Optical fiber 144 may provide optical coupling to photonic package 100 with other parts of a system. In various embodiments, optical glue 140 may extend past lateral side 142 of PIC 102 onto lateral sides of mold 136, interposer 116, and/or second-level underfill 132, for example as indicated in FIGS. 1C-1E, to enable various positioning and sizes of optical lens 138.

Note that FIGS. 1A-3 are intended to show relative arrangements of the components within their assemblies, and that, in general, such assemblies may include other components that are not illustrated (e.g., various interfacial layers or various other components related to optical functionality, electrical connectivity, or thermal mitigation). For example, in some further embodiments, the assemblies as shown in FIGS. 1A-3 may include multiple PICs, EICs, and/or XPUs along with other electrical components.

Additionally, although some components of the assemblies are illustrated in FIGS. 1A-3 as being planar rectangles or formed of rectangular solids, this is simply for ease of illustration, and embodiments of these assemblies, in particular embodiments of first-level underfill 130, second-level underfill 132 and optical glue 140, or embodiments of other portions of PIC 102, may be curved, rounded, or otherwise irregularly shaped as dictated by and sometimes inevitable due to the manufacturing processes used to fabricate various components.

In various embodiments, any of the features discussed with reference to any of FIGS. 1A-3 herein may be combined with any other features to form a package with one or more PICs as described herein, for example, to form a modified photonic package 100 or a modified PIC 102. Some such combinations are described above, but, in various embodiments, further combinations and modifications are possible.

Example Methods

FIGS. 4A-4H are schematic illustrations of various process steps associated with fabricating photonic package 100. Although FIGS. 4A-4H illustrate various operations performed in a particular order, this is simply illustrative and the operations discussed herein may be reordered and/or repeated as suitable. Further, additional processes which are not illustrated may also be performed without departing from the scope of the present disclosure. Also, various ones of the operations discussed herein with respect to FIGS. 4A-4H may be modified in accordance with the present disclosure to fabricate others of photonic package 100 disclosed herein.

Figure 4A:
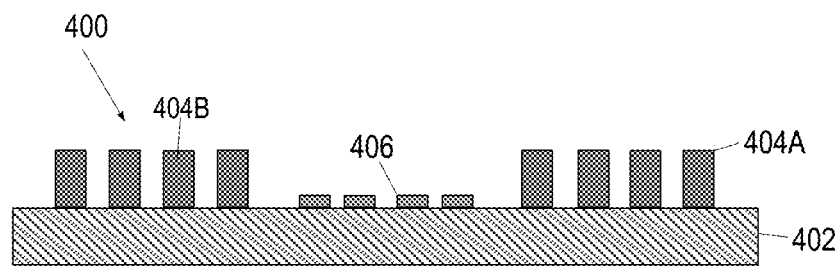
FIGS. 4A-4H are schematic cross-sectional illustrations of various stages in an example process to fabricate a photonic package, according to some embodiments of the present disclosure.

FIG. 4A illustrates an assembly 400 comprising a carrier wafer 402 plated or otherwise deposited with conductive material, such as copper, to generate traces (not shown), planes (not shown), tall pillars 404A and 404B, and short pillars 406. Any suitable manufacturing technique (such as additive, subtractive, semi-additive, etc.) may be used to manufacture assembly 400. In various embodiments, the metallization may be formed using any known process in the art, including electroplating, photolithography, etc. In various embodiments, carrier wafer 402 may comprise a semiconductor material. In some embodiments, carrier wafer 402 may comprise any rigid, non-conductive material, such as alumina, that can provide mechanical support to the deposited metallization. In various embodiments, the metallization may comprise copper; in some embodiments, the metallization may comprise aluminum; in some embodiments, the metallization may comprise metal alloys of various compositions.

Figure 4B:
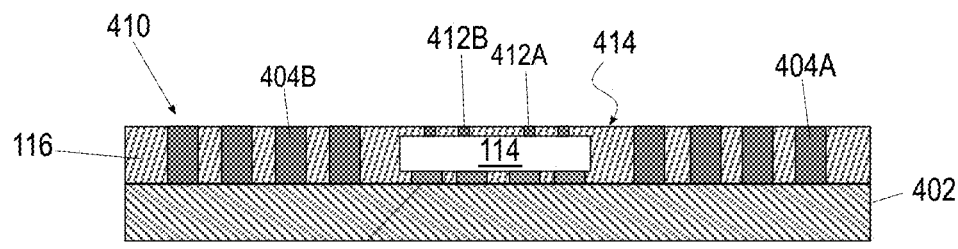

FIG. 4B illustrates an assembly 410 wherein EIC 114 is disposed proximate to (e.g., on top of) short pillars 406. Any known method may be used to dispose EIC 114, for example, automated pick-and-place. Additional metal traces and small pillars 412A and 412B may be formed on EIC 408. Interposer 116 may be formed on carrier wafer 402 such that it encompasses EIC 114 and the metallization, including tall pillars 404A and 404B, short pillars 406 and small pillars 412A and 412B. In various embodiments, interposer 116 may be dispensed in liquid form such that it flows around and conforms to various shapes of components and metallization atop carrier wafer 402. Assembly 410 may be subjected to a process, for example, curing, that solidifies interposer 116. Surface 414 of assembly 410, for example, a top surface, may be substantially planarized by a suitable process such as chemical mechanical polishing (CMP).

Figure 4C:
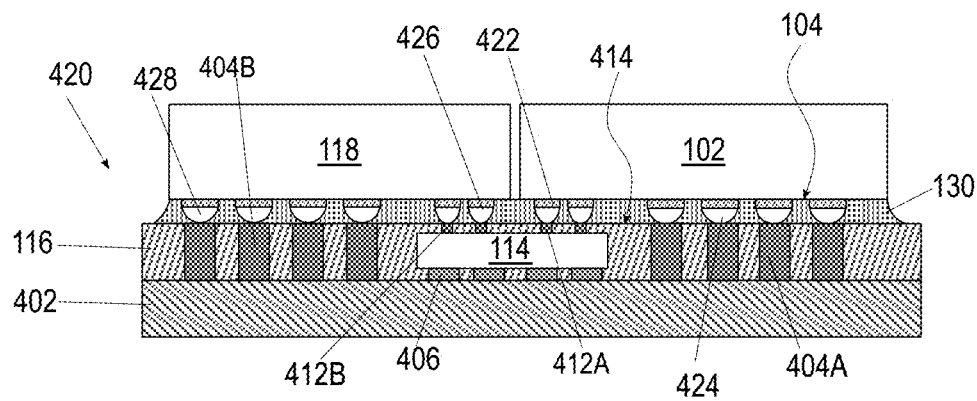

FIG. 4C illustrates an assembly 420 in which PIC 102 may be disposed over surface 414. PIC 102 may comprise conductive DTD interconnects 422 and DTPS interconnects 424. PIC 102 may be disposed such that interconnects 422 provide electrical coupling from PIC 102 to EIC 114, for example, through small pillars 412A, which function as vias along with other conductive traces and pads as appropriate. Interconnects 424 may provide electrical coupling from PIC 102 to tall pillars 404A, which function as TMVs through interposer 116 along with other conductive traces and pads as appropriate. Note that interconnects 422 and 424 are shown aligned with small pillars 412A and tall pillars 404A respectively merely for illustrative purposes. In some embodiments, they may be so aligned; in other embodiments, appropriate conductive traces on interposer 116, for example, may function as redistributive circuitry, enabling coupling from interconnects 422 and 424 to small pillars 412A and tall pillars 404A as appropriate.

In various embodiments, optical structures disposed over active side 104 of PIC 102 may be covered by a protective coating (not shown) before disposing in assembly 420 to prevent any breakage or contamination during the fabrication operations, or to avoid leaking of optical signals during operation of PIC 102, or for other appropriate reasons.

XPU 118 having conductive DTD interconnects 426 and DTPS interconnects 428 may be disposed over surface 414 such that interconnects 424 provide electrical coupling from XPU 118 to EIC 114, for example, through small pillars 412B that function as vias along with other conductive traces and pads as appropriate. Interconnects 428 may provide electrical coupling from XPU 118 to tall pillars 404B, which function as TMVs through interposer 116 along with other conductive traces and pads as appropriate. Note that interconnects 426 and 428 are shown aligned with small pillars 412B and tall pillars 404B respectively merely for illustrative purposes. In some embodiments, they may be so aligned; in other embodiments, appropriate conductive traces on interposer 116, for example, may function as redistributive circuitry, enabling electrical coupling from interconnects 426 and 428 to small pillars 412B and tall pillars 404B as appropriate.

Assembly 420 may be subjected to a solder reflow process during which solder components of interconnects 422, 424, 426 and 428 melt and bond with metallization on surface 414, mechanically coupling PIC 102 and XPU 118 to interposer 116. first-level underfill 130 may be dispensed in a space bounded on one side by surfaces of PIC 102 and XPU 118 and on an opposite side by surface 414 of interposer 116, filling any interstitial gaps therein. Assembly 420 may be subjected to a curing process during which first-level underfill 130 solidifies in place.

Figure 4D:
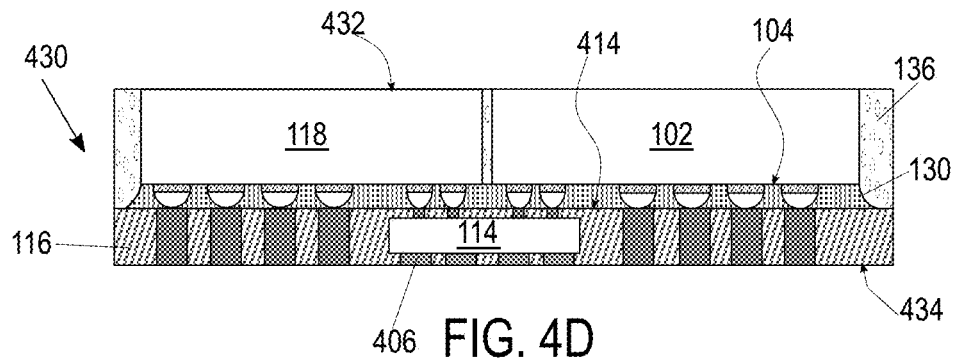

FIG. 4D illustrates an assembly 430 subsequent to a further molding operation. Mold 136 may be dispensed on interposer 116 and cured or otherwise solidified. A grind back process may allow surface 432 of assembly 430 to be substantially planar. A planar surface can allow other components, such as heat sinks to be easily attached to surface 432. Carrier wafer 402 may be separated thereafter from assembly 430 using any known process, exposing surface 434 of interposer 116 opposite surface 414.

Figure 4E:
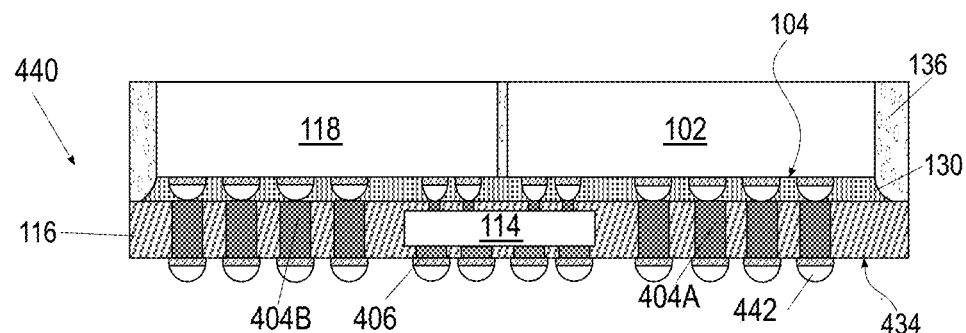

FIG. 4E illustrates an assembly 440 subsequent to disposing interconnects 442 and metallization, including pads, traces (not shown) and planes (not shown) on surface 434 of interposer 116 using any known process, including electroplating metallization, screen-printing solder, and baking in a solder reflow process. Tall metal pillars 404A, 404B and short metal pillars 406 and/or conductive traces on surface 434 may enable suitable electrical coupling from PIC 102, EIC 114 and XPU 118 to interconnects 442. In various embodiments, interconnects 442 may comprise DTPS interconnects, or package-to-package interconnects, for example, BGAs.

Figure 4F:
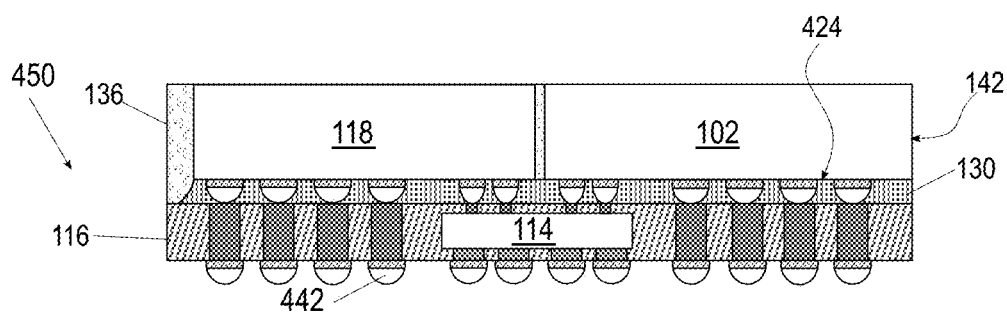

FIG. 4F illustrates an assembly 450 subsequent to a dicing process in which individual photonic packages are cut and separated. Any suitable dicing process may be used, including scribe dicing, blade dicing, laser dicing, or plasma dicing. A periphery of assembly 450 may be subjected to grinding and polishing to generate lateral side 142 on PIC 102 on which waveguide 110 are exposed at appropriate locations. Polishing lateral side 142 can enable a substantially clean surface with suitable surface quality, for example, substantially free of blemishes that can degrade optical signal quality. Waveguide 110 on active side 104 of PIC 102 may be exposed appropriately along lateral side 142.

Figure 4G:
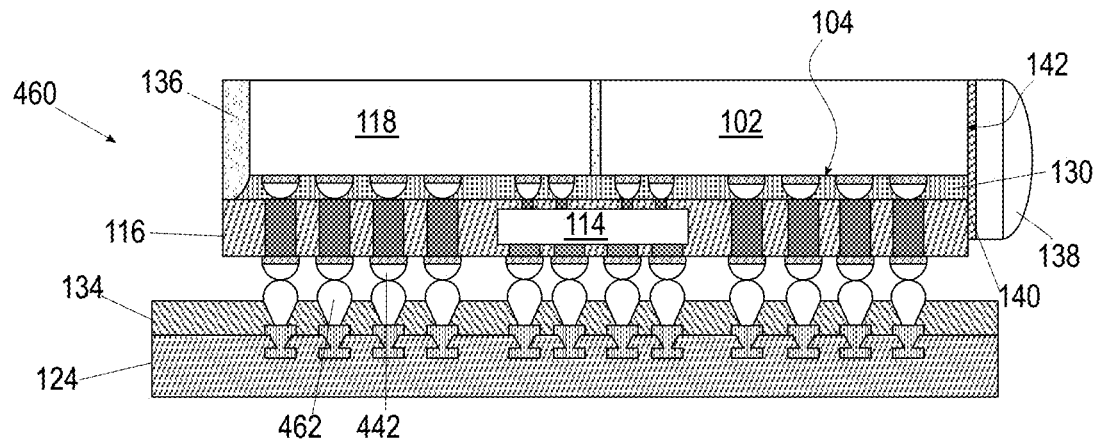

FIG. 4G illustrates an assembly 460 subsequent to disposing assembly 450 over package support 124 such that interconnects 462 on package support 124 are aligned substantially with interconnects 442 on interposer 116. Solder resist 134 may be disposed around interconnects 462 prior to disposing assembly 450 over package support 124. Interconnects 442 on interposer 116 may integrate with interconnects 462 on package support 124 during a solder reflow process, mechanically coupling interposer 116 and associated components to package support 124. Optical lens 138 may be attached to lateral side 142 using optical glue 140. In some embodiments, optical lens 138 may be attached to lateral side 142 before interposer 116 is attached to package support 124; in other embodiments, optical lens 138 may be attached to lateral side 142 after interposer 116 is attached to package support 124.

Figure 4H:
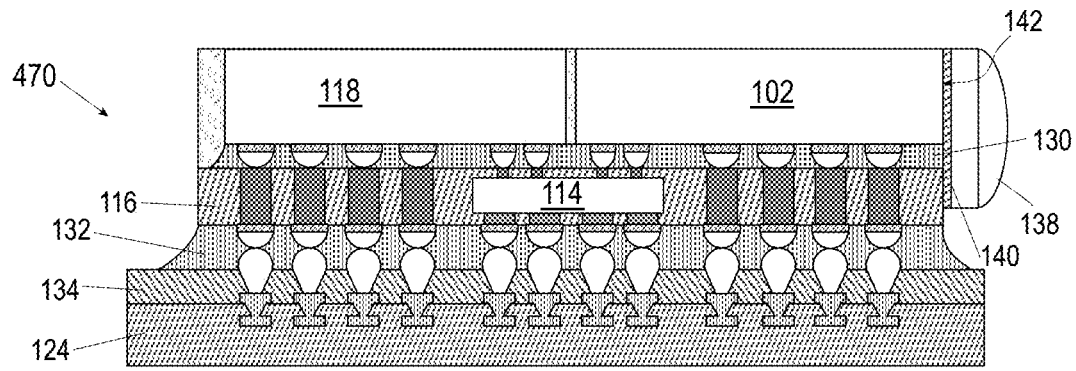

FIG. 4H illustrates an assembly 470 subsequent to dispensing second-level underfill 132 between interposer 116 and package support 124. Second-level underfill 132 may be cured according to known processes. In various embodiments, second-level underfill 132 may be disposed over solder resist 134 and may fill interstitial gaps between interposer 116 and solder resist 134.

FIGS. 5A-5H are schematic illustrations of various process steps associated with fabricating photonic package 100. Although FIGS. 5A-5H illustrate various operations performed in a particular order, this is simply illustrative, and the operations discussed herein may be reordered and/or repeated as suitable. Further, additional processes which are not illustrated may also be performed without departing from the scope of the present disclosure. Also, various ones of the operations discussed herein with respect to FIGS. 5A-5H may be modified in accordance with the present disclosure to fabricate others of photonic package 100 disclosed herein.

Figure 5A:
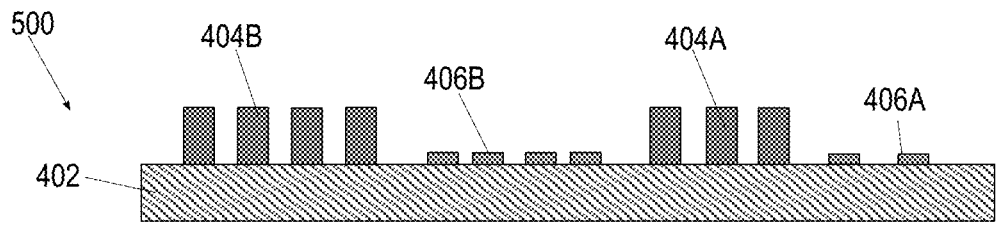
FIGS. 5A-5H are schematic cross-sectional illustrations of various stages in another example process to fabricate a photonic package, according to some embodiments of the present disclosure.

FIG. 5A illustrates an assembly 500 comprising a carrier wafer 402 plated or otherwise deposited with conductive material, such as copper, to generate traces (not shown), planes (not shown), tall pillars 404A and 404B, and short pillars 406A and 406B. In various embodiments, the metallization may be formed using any known process in the art, including electroplating, photolithography, etc.

Figure 5B:
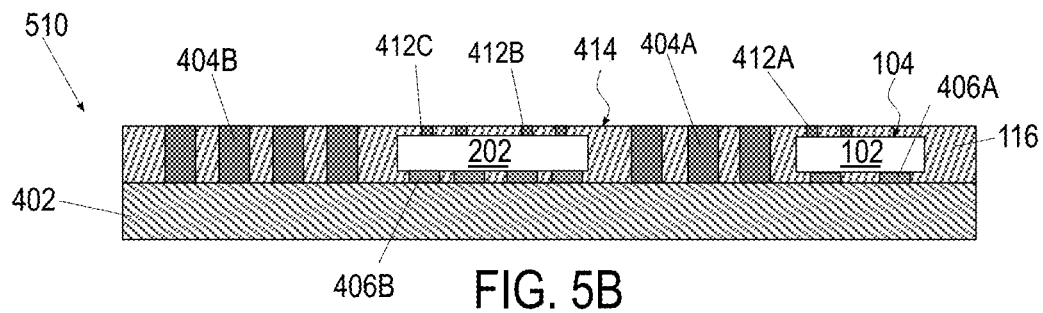

FIG. 5B illustrates an assembly 510 subsequent to disposing PIC 102 and bridge IC 202 proximate to (e.g., on top of) short pillars 406A and 406B, respectively. Any known method may be used to dispose PIC 102 and bridge IC 202, for example, automated pick-and-place. Active side 104 of PIC 102 may be disposed over one side of PIC 102 in some embodiments (as shown) facing away from carrier wafer 402. In other embodiments (not shown), active side 104 may be disposed over an opposite side of PIC 104. In various embodiments, optical structures disposed over active side 104 of PIC 102 may be covered by a protective coating (not shown) for various reasons, for example, to prevent any breakage or contamination during the fabrication process; to facilitate optical coupling; to prevent leakage of optical signals during operation; etc.

Additional metal traces and small pillars 412A may be formed on PIC 102; metal traces and small pillars 4126 and 412C may be formed on bridge IC 202. Interposer 116 may be formed on carrier wafer 402 such that it encompasses PIC 102, bridge IC 202, and the metallization, including tall pillars 404A and 404B, short pillars 406A and 406B and small pillars 412A, 4126, and 412C. In various embodiments, interposer 116 may be dispensed in liquid form such that it flows around and conforms to various shapes of components and metallization atop carrier wafer 402. Assembly 510 may be subjected to a process, for example, curing, that solidifies interposer 116. Surface 414 of assembly 510, for example, a top surface, may be substantially planarized by a suitable process such as CMP.

Figure 5C:
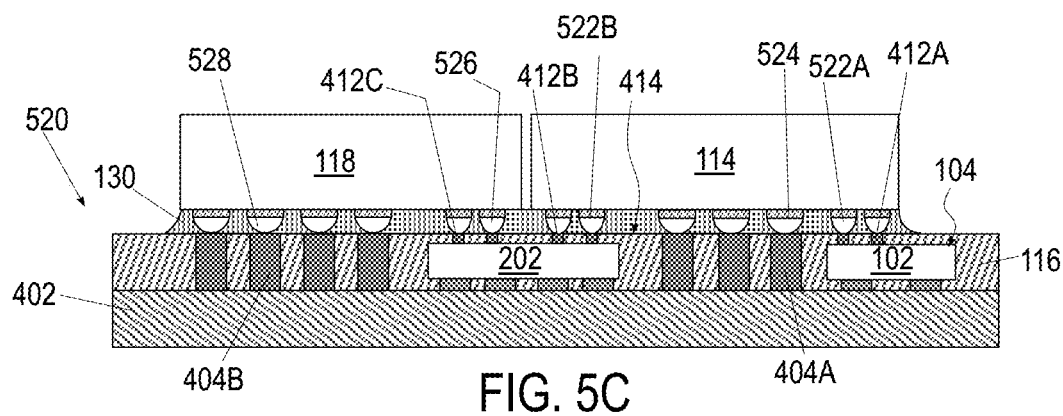

FIG. 5C illustrates an assembly 520 subsequent to disposing EIC 114 and XPU 118 over surface 414 of interposer 116. EIC 114 may be disposed such that DTD interconnects 522A on EIC 114 may be electrically coupled to PIC 102 through small pillars 412A and associated conductive traces, planes, and pads. DTD interconnects 522B on EIC 114 may be electrically coupled to bridge IC 202 through small pillars 412B and associated conductive traces, planes and pads. DTPS interconnects 524 on EIC 114 may be electrically coupled with tall pillars 404A through associated conductive traces, planes, and pads.

XPU 118 may be disposed such that DTD interconnects 526 may be electrically coupled to bridge IC 202 through small pillars 412C and associated conductive traces, planes and pads. DTPS interconnects 428 may be electrically coupled to tall pillars 404B through associated conductive traces, planes, and pads. Assembly 520 may be subjected to a solder reflow process during which solder components of interconnects 522A, 522B, 524, 526 and 428 melt and bond with metallization on surface 414, mechanically coupling EIC 114 and XPU 118 to interposer 116. First-level underfill 130 may be dispensed in a space bounded on one side by surfaces of EIC 114 and XPU 118 and on an opposite side by surface 414 of interposer 116.

Figure 5D:
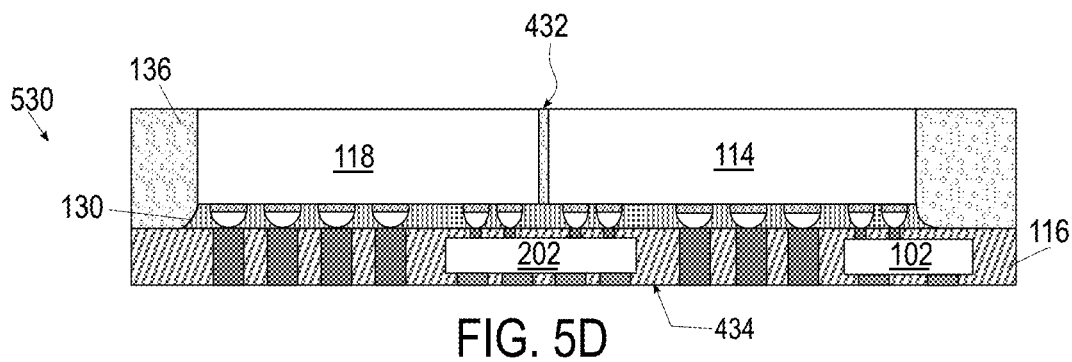

FIG. 5D illustrates an assembly 530 subsequent to dispensing mold 136 on interposer 116. Mold 136 may be cured or otherwise solidified, for example through a baking process. A grind back operation may allow surface 432 of assembly 530 to be substantially planar. Carrier wafer 402 may be separated from assembly 530 using any known process, exposing surface 434 (e.g., "underside") of interposer 116 opposite surface 432.

Figure 5E:
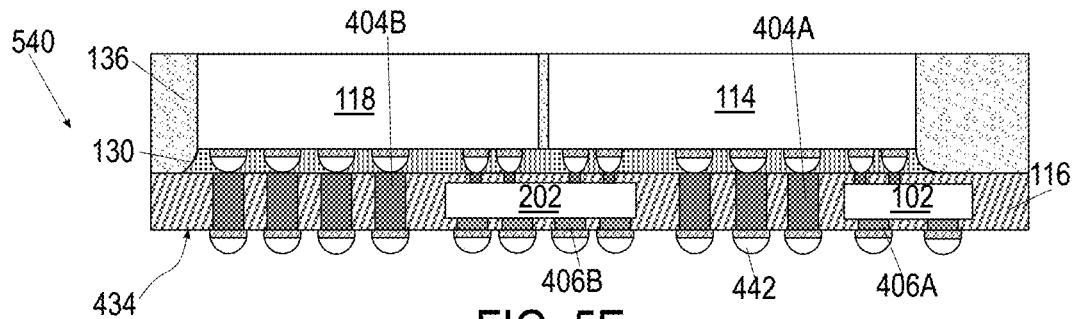

FIG. 5E illustrates an assembly 540 subsequent to disposing interconnects 442 and metallization, including pads, traces (not shown) and planes (not shown) over surface 434 of interposer 116 using any known process, including electroplating metallization, screen-printing solder, and baking in a solder reflow process. Tall metal pillars 404A, 404B and short metal pillars 406A and 406B and/or conductive traces on surface 434 may enable suitable electrical coupling from PIC 102, EIC 114, XPU 118 and bridge IC 202 to interconnects 442.

Figure 5F:
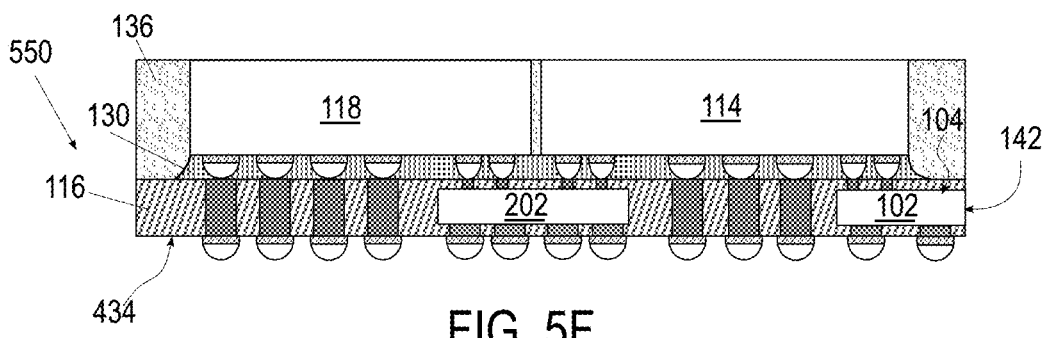

FIG. 5F illustrates an assembly 550 subsequent to a dicing operation in which individual photonic packages are cut and separated. Any suitable dicing process may be used, including scribe dicing, blade dicing, laser dicing, or plasma dicing. A periphery of assembly 550 may be subjected to grinding and polishing to generate lateral side 142 on PIC 102. Waveguide 110 on active side 104 of PIC 102 may be exposed along lateral side 142.

Figure 5G:
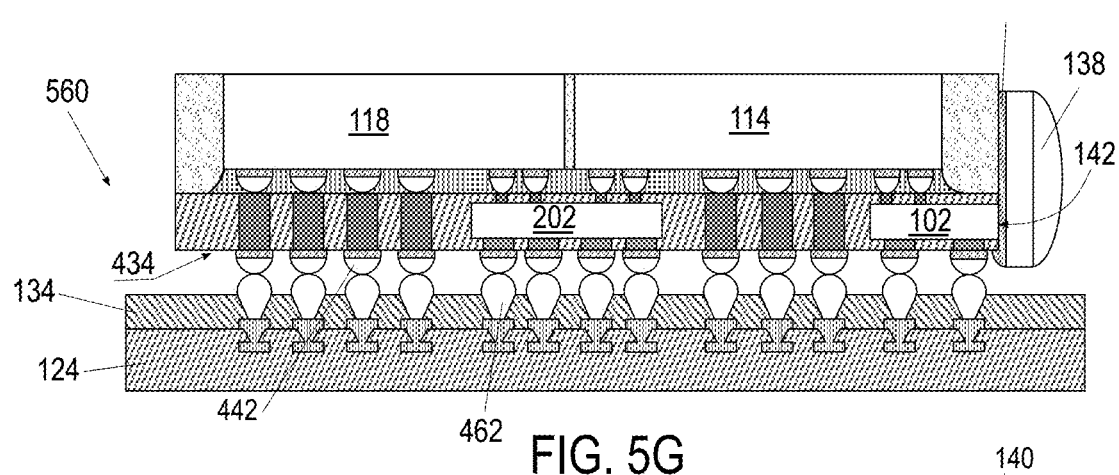

FIG. 5G illustrates an assembly 560 subsequent to attaching optical lens 138 on surface 142 of PIC 102 using optical glue 140. Interposer 116 may be disposed over package support 124 comprising solder resist 134 around interconnects 462. Interconnects 462 on package support 124 may be aligned substantially with interconnects 442 on interposer 116. Solder resist 134 may be disposed around interconnects 462 prior to disposing assembly 560 over package support 124. Interconnects 442 on interposer 116 may integrate with interconnects 462 on package support 124 during a solder reflow process, mechanically coupling interposer 116 and associated components to package support 124. In some embodiments, optical lens 138 may be attached to lateral side 142 before interposer 116 is disposed over package support 124; in other embodiments, optical lens 138 may be attached to lateral side 142 after interposer 116 is disposed over package support 124.

Figure 5H:
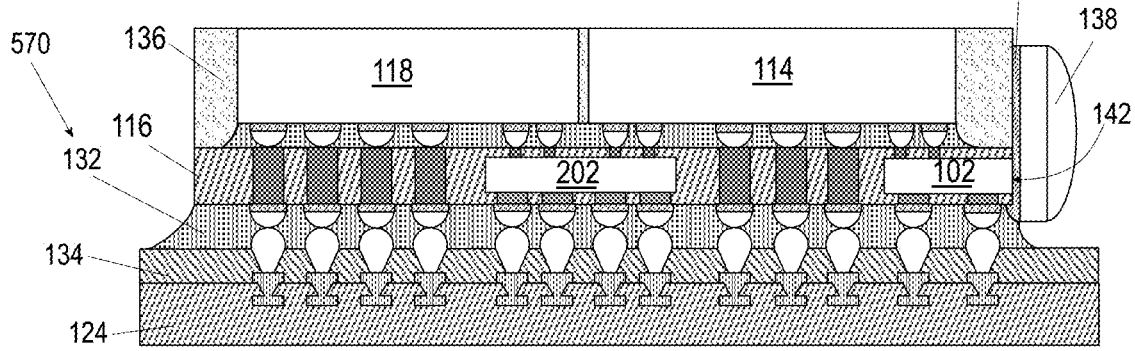

FIG. 5H illustrates an assembly 570 subsequent to dispensing second-level underfill 132 between interposer 116 and package support 124. Second-level underfill 132 may be cured according to known processes. In various embodiments, second-level underfill 132 may be disposed above solder resist 134 and may fill interstitial gaps between interposer 116 and solder resist 134.

FIGS. 6A-6I are schematic illustrations of various process steps associated with fabricating photonic package 100. Although FIGS. 6A-6I illustrate various operations performed in a particular order, this is simply illustrative and the operations discussed herein may be reordered and/or repeated as suitable. Further, additional processes which are not illustrated may also be performed without departing from the scope of the present disclosure. Also, various ones of the operations discussed herein with respect to FIGS. 6A-6I may be modified in accordance with the present disclosure to fabricate others of photonic package 100 disclosed herein.

Figure 6A:
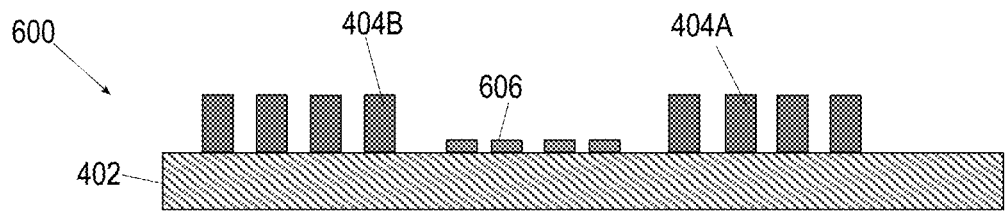
FIGS. 6A-6I are schematic cross-sectional illustrations of various stages in yet another example process to fabricate a photonic package, according to some embodiments of the present disclosure.

FIG. 6A illustrates an assembly 600 comprising a carrier wafer 402 plated or otherwise deposited with conductive material, such as copper, to generate traces (not shown), planes (not shown), tall pillars 404A and 404B, and short pillars 406.

Figure 6B:
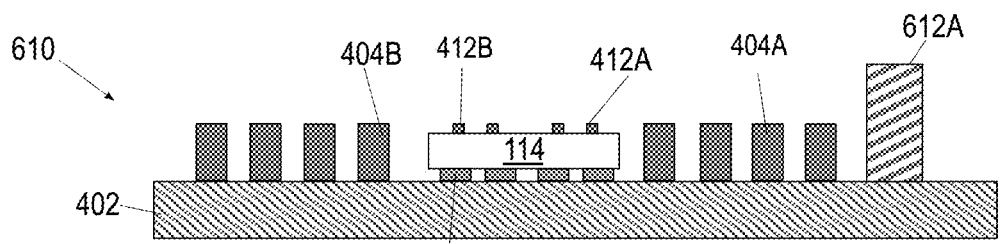

FIG. 6B illustrates an assembly 610 comprising EIC 114 disposed proximate to (e.g., on top of) short pillars 406. Any known method may be used to dispose EIC 114, for example, automated pick-and-place. Additional metal traces and small pillars 412A and 412B may be formed on EIC 114. A sacrificial material 612A may be formed on carrier wafer 402, using any known process, for example, dispensing sacrificial material 412A in liquid form and then subjecting to a solidification process. Sacrificial material 612A may comprise materials that can be removed during the fabrication process without significantly affecting other materials in assembly 610. As examples, and not as limitations, sacrificial material 612A may comprise meltable wax, etchable polymers, organic materials that have a lower burning point than other materials in assembly 610, soluble compounds that can be washed off with water or other suitable solvents that do not significantly affect other materials in assembly 610.

Figure 6C:
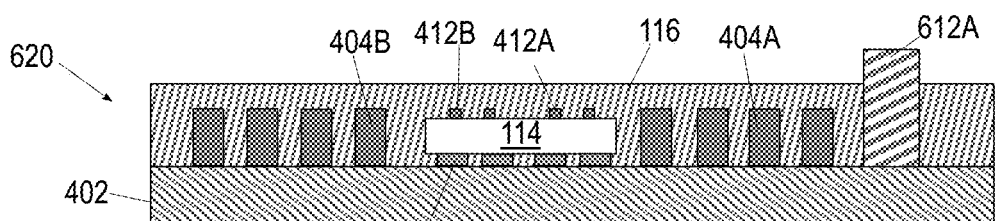

FIG. 6C illustrates an assembly 620 subsequent to forming interposer 116 on carrier wafer 402 such that it encompasses EIC 114, sacrificial material 612A, and any metallization, including tall pillars 404A and 404B, short pillars 406 and small pillars 412A and 412B. In various embodiments, interposer 116 may be dispensed in liquid form such that it flows around and conforms to various shapes of components and metallization atop carrier wafer 402. Assembly 620 may be subjected to a process, for example, curing, that solidifies interposer 116.

Figure 6D:
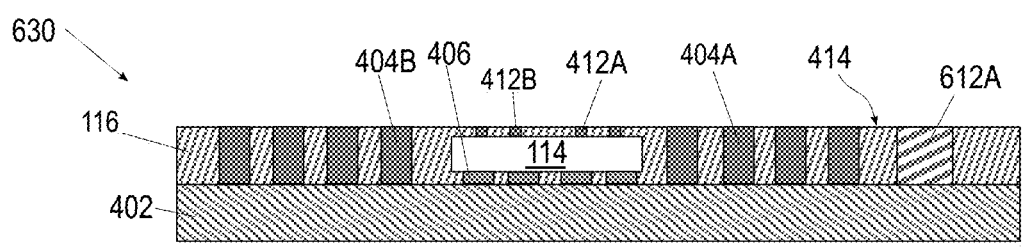

FIG. 6D illustrates an assembly 630 subsequent to a planarization operation in which surface 414 (e.g., top surface) of interposer 116, may be substantially planarized by a suitable process such as CMP such that metallization within interposer 116 is exposed appropriately to allow additional components to be mounted on surface 414.

Figure 6E:
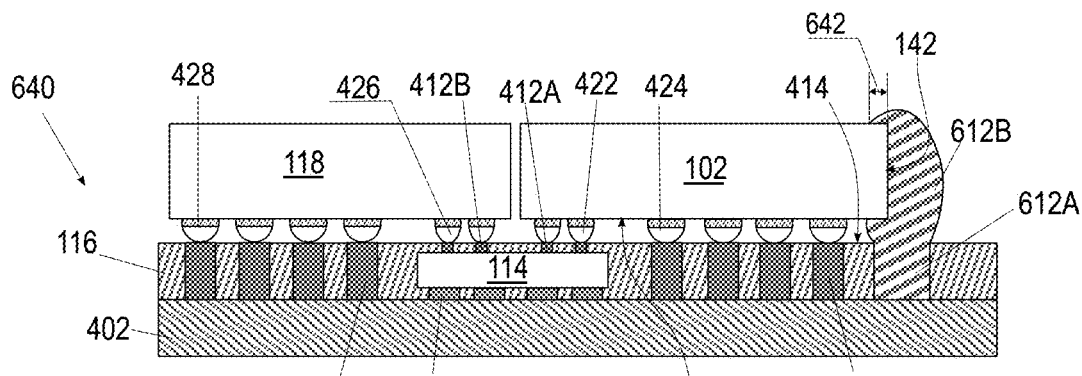

FIG. 6E illustrates an assembly 640 subsequent to disposing PIC 102 and XPU 118 over surface 414 of interposer 116. In various embodiments, DTD interconnects 422 and DTPS interconnects 424 of PIC 102 may be disposed over active side 104 of PIC 102. In various embodiments, optical structures disposed over active side 104 of PIC 102 may be covered by a protective coating (not shown) to prevent any breakage or contamination during the fabrication process. PIC 102 may be disposed over interposer 116 such that interconnects 422 provide electrical coupling from PIC 102 to EIC 114, for example, through small pillars 412A, which function as vias along with other conductive traces and pads as appropriate. Interconnects 424 may provide electrical coupling from PIC 102 to tall pillars 404A, which function as TMVs through interposer 116 along with other conductive traces and pads as appropriate. Note that interconnects 422 and 424 are shown aligned with small pillars 412A and tall pillars 404A respectively merely for illustrative purposes. In some embodiments, they may be so aligned; in other embodiments, appropriate conductive traces on interposer 116, for example, may function as redistributive circuitry, enabling coupling from interconnects 422 and 424 to small pillars 412A and tall pillars 404A as appropriate.

XPU 118 having conductive DTD interconnects 426 and DTPS interconnects 428 may be disposed over surface 414 such that interconnects 424 provide electrical coupling from XPU 118 to EIC 114, for example, through small pillars 412B that function as vias along with other conductive traces and pads as appropriate. Interconnects 428 may provide electrical coupling from XPU 118 to tall pillars 404B, which function as TMVs through interposer 116 along with other conductive traces and pads as appropriate. Note that interconnects 426 and 428 are shown aligned with small pillars 412B and tall pillars 404B respectively merely for illustrative purposes. In some embodiments, they may be so aligned; in other embodiments, appropriate conductive traces on interposer 116, for example, may function as redistributive circuitry, enabling coupling from interconnects 426 and 428 to small pillars 412B and tall pillars 404B as appropriate. Assembly 640 may be subjected to a solder reflow process during which solder components of interconnects 422, 424, 426 and 428 melt and bond with metallization on surface 414, mechanically coupling PIC 102 and XPU 118 to interposer 116.

Additional sacrificial material 612B may be dispensed around a periphery of PIC 102 proximate to lateral side 142 such that there is an overlap 642 around PIC 102. Overlap 642 may be sized to provide sufficient protection for exposed waveguide 110 and other components on surface 142 of PIC 102 during subsequent fabrication processes. Overlap 642 may also be sized based on other considerations, such as dimensions of a shape formed when sacrificial material 612B is removed in a subsequent operation, a volume of optical glue to be dispensed in a subsequent operation into the space, overall dimensions of the final photonic package, and optical alignment considerations of the final photonic package in a system. In some embodiments, overlap 642 may not be controlled, and its size may depend upon a volume of material dispensed, the material's viscosity and other physical properties, and location of deposition on surface 414.

The shapes shown in the figure are merely for illustrative purposes; for example, additional sacrificial material 612B may take any shape according to its viscosity, manner of deposition, etc. In some embodiments, additional sacrificial material 612B may be a solid block; in other embodiments, additional sacrificial material 612B may be a liquid; in yet other embodiments, additional sacrificial material 612B may be a semi-liquid. In some embodiments, further processing steps, such as curing or baking, may be undertaken to solidify additional sacrificial material 612B. In some embodiments, additional sacrificial material 612B may be different from previously applied sacrificial material 612A.

In other embodiments, additional sacrificial material 612B may be the same as previously applied sacrificial material 612A.

Figure 6F:
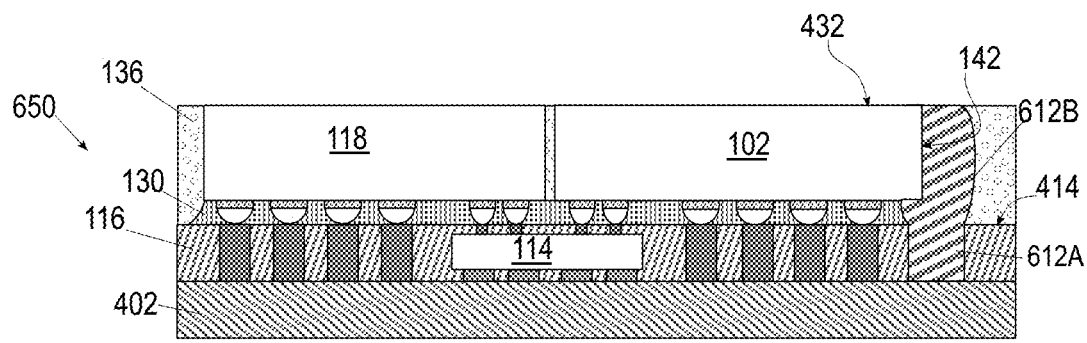

FIG. 6F illustrates an assembly 650 subsequent to dispensing first-level underfill 130 in a space bounded on one side by surfaces of PIC 102 and XPU 118 and on an opposite side by surface 414 of interposer 116. Mold 136 may be dispensed on interposer 116 and cured or otherwise solidified. A grind back process may allow surface 432 (e.g., "topside") of assembly 650 to be substantially planar.

Figure 6G:
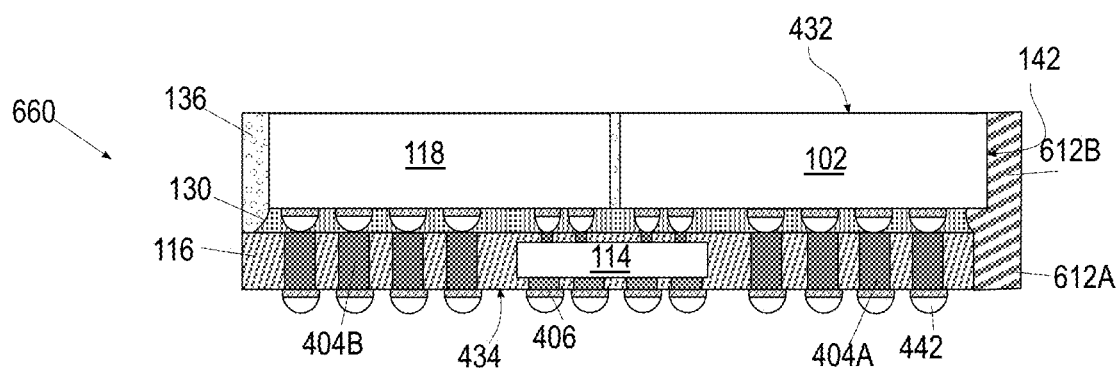

FIG. 6G illustrates an assembly 660 subsequent to separating carrier wafer 602 and dicing out individual photonic packages. Carrier wafer 602 may be separated from assembly 660 using any known process, exposing a surface 434 (e.g., on the bottom) opposite surface 432 of assembly 660. Any suitable dicing process may be used to cut and separate individual photonic packages, including scribe dicing, blade dicing, laser dicing, or plasma dicing. Interconnects 442 and metallization, including pads, traces (not shown) and planes (not shown) may be disposed over surface 434 of interposer 116 using any known process, including electroplating metallization, screen-printing solder, and baking in a solder reflow process. In some embodiments, interconnects 442 and the metallization may be disposed before dicing; in other embodiments, interconnects 442 and the metallization may be disposed after dicing. Tall metal pillars 404A, 404B and short metal pillars 406 and/or conductive traces on surface 434 may enable suitable electrical coupling from PIC 102, EIC 114 and XPU 118 to interconnects 442.

Figure 6H:
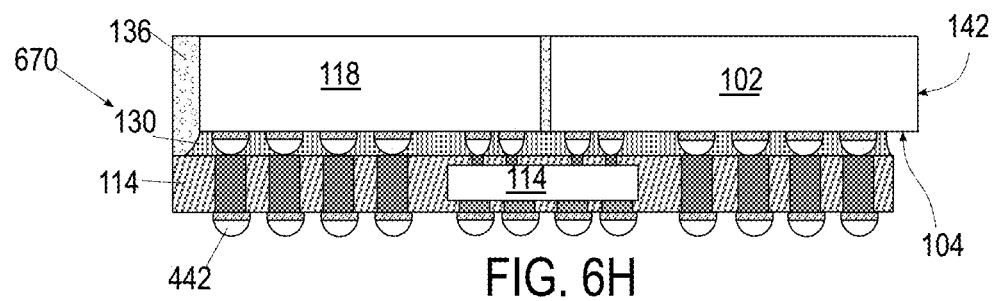

FIG. 6H illustrates an assembly 670 subsequent to removing sacrificial material 612A and 612B using any suitable process according to the type of sacrificial material. For example, wax may be melted away. Soluble compounds may be dissolved away in an appropriate solvent. In some embodiments, sacrificial material 612A and/or 612B may be ablated away. In some embodiments, the material may be peeled off. Removal of sacrificial material 612A and 612B may expose lateral side 142 along with waveguide 110 disposed thereon.

Figure 6I:
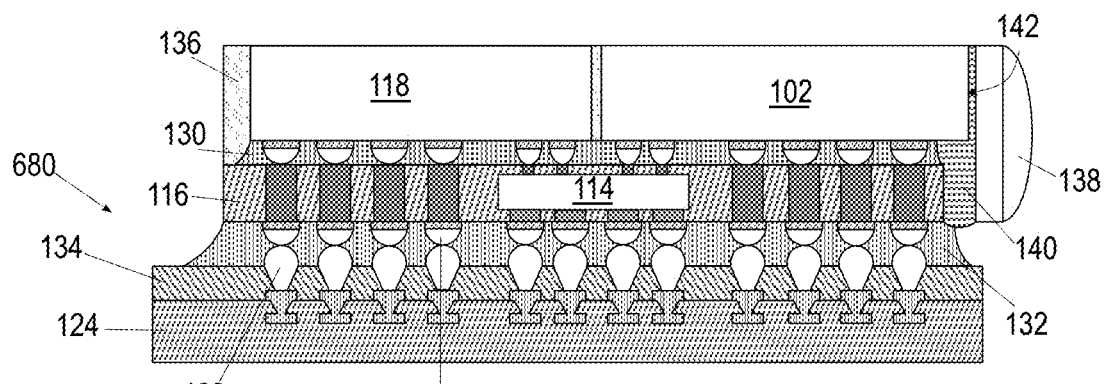

FIG. 6I illustrates an assembly 680 subsequent to disposing over package support 124 such that interconnects 462 on package support 124 are aligned substantially with interconnects 442 on interposer 116. Solder resist 134 may be disposed around interconnects 462 prior to disposing assembly 450 over package support 124. Interconnects 442 on interposer 116 may integrate with interconnects 462 on package support 124 during a solder reflow process, mechanically coupling interposer 116 and associated components to package support 124. Optical lens 138 may be attached to lateral side 142 using optical glue 140. In some embodiments wherein PIC 102 comprises V-grooves monolithically integrated therein and exposed along lateral side 142 upon removal of sacrificial material 612A and/or 612B, optical fiber 144 may be directly coupled to PIC 102 without intermediate optical lens 138. An amount of optical glue 140 dispensed may be just sufficient to adhere optical lens 138 to PIC 102 in some embodiments; in other embodiments, the amount of optical glue 140 dispensed may be based on other considerations as well, such as mechanical stability and reliability. In some embodiments, optical glue 140 may substantially extend across an entire surface of optical lens 138 proximate to PIC 102. In other embodiments, optical glue 140 may not substantially extend across the entire surface of optical lens 138 proximate to PIC 102. In some embodiments, optical lens 138 may be attached to lateral side 142 before interposer 116 is attached to package support 124; in other embodiments, optical lens 138 may be attached to lateral side 142 after interposer 116 is attached to package support 124. Second-level underfill 132 may be disposed between interposer 116 and package support 124. Second-level underfill 132 may be cured according to known processes. In various embodiments, second-level underfill 132 may be disposed over solder resist 134 and may fill interstitial gaps between interposer 116 and solder resist 134. Second-level underfill 132 may form a fillet under optical lens 138 depending at least on the position of optical lens 138 relative to package support 124.

FIGS. 7A-7J are schematic illustrations of various process steps associated with fabricating photonic package 100. Although FIGS. 7A-7J illustrate various operations performed in a particular order, this is simply illustrative, and the operations discussed herein may be reordered and/or repeated as suitable. Further, additional processes which are not illustrated may also be performed without departing from the scope of the present disclosure. Also, various ones of the operations discussed herein with respect to FIGS. 7A-7J may be modified in accordance with the present disclosure to fabricate others of photonic package 100 disclosed herein.

Figure 7A:
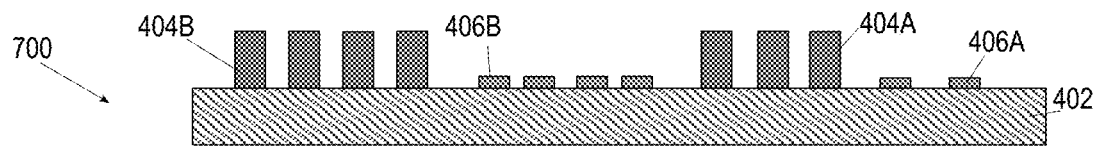
FIGS. 7A-7J are schematic cross-sectional illustrations of various stages in yet another example process to fabricate a photonic package, according to some embodiments of the present disclosure.

FIG. 7A illustrates an assembly 700 comprising a carrier wafer 402 plated or otherwise deposited with conductive material, such as copper, to generate traces (not shown), planes (not shown), tall pillars 404A and 404B, and short pillars 406A and 406B. In various embodiments, the metallization may be formed using any known process in the art, including electroplating, photolithography, etc.

Figure 7B:
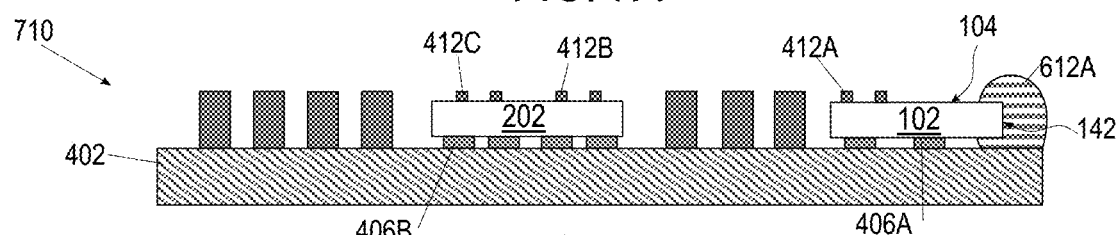

FIG. 7B illustrates an assembly 710 subsequent to disposing PIC 102 and bridge IC 202 proximate to (e.g., on top of) short pillars 406A and 406B, respectively. Any known method may be used to dispose PIC 102 and bridge IC 202, for example, automated pick-and-place. Active side 104 of PIC 102 may be disposed over one side of PIC 102 in some embodiments (as shown) facing away from carrier wafer 402. In other embodiments (not shown), active side 104 may be disposed over an opposite side of PIC 104. In various embodiments, optical structures disposed over active side 104 of PIC 102 may be covered by a protective coating (not shown) for various reasons, for example, to prevent any breakage or contamination during the fabrication process, or to prevent leakage of optical signals during operation, etc. Additional metal traces and small pillars 412A may be formed on PIC 102; metal traces and small pillars 412B and 412C may be formed on bridge IC 202. Sacrificial material 612A may be disposed proximate to PIC 102, for example, sufficient to envelop exposed waveguide 110 on surface 142 of PIC 102 and provide protection to these components during subsequent fabrication processes. In various embodiments, a volume of sacrificial material 612A and location of deposition on carrier wafer 402 may be based upon optical alignment considerations of various components relative to PIC 102.

Figure 7C:
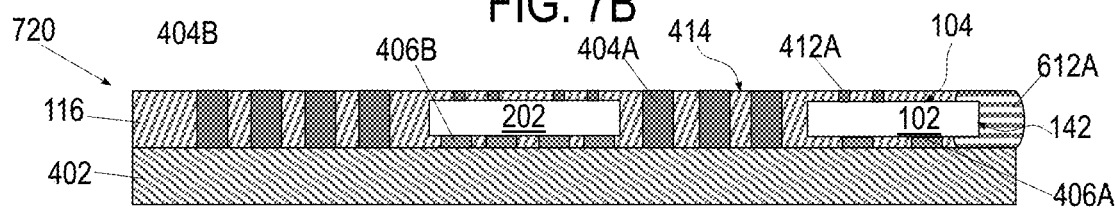

FIG. 7C illustrates an assembly 720 subsequent to disposing interposer 116. In various embodiments, interposer 116 may be dispensed in liquid form such that it flows around and conforms to various shapes of components and metallization atop carrier wafer 402. Assembly 510 may be subjected to a process, for example, curing, that solidifies interposer 116. Surface 414 of assembly 510, for example, a top surface, may be substantially planarized by a suitable process such as CMP.

Figure 7D:
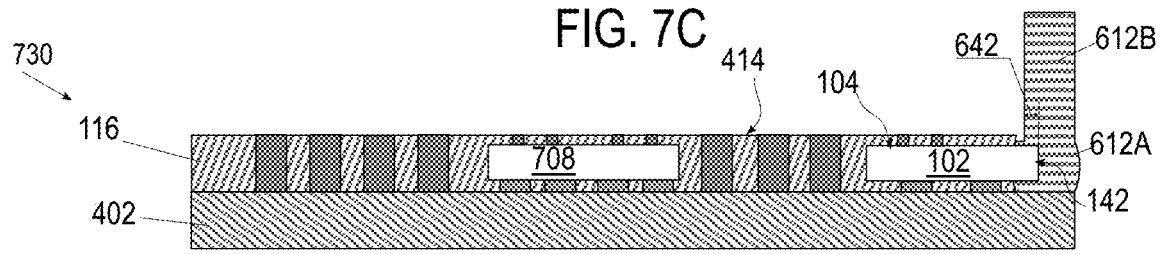

FIG. 7D illustrates an assembly 730 subsequent to disposing additional sacrificial material 612B around a periphery of PIC 102 proximate to lateral side 142 such that overlap 642 is formed around PIC 102. Overlap 642 may also be sized based on other considerations, such as dimensions of a shape formed when sacrificial material 612B is removed in a subsequent operation, a volume of optical glue to be dispensed in a subsequent operation into the space, overall dimensions of the final photonic package, and optical alignment considerations of the final photonic package in a system. In some embodiments, overlap 642 may not be controlled, and its size may depend upon a volume of material dispensed, the material's viscosity and other physical properties, and location of deposition on surface 414.

Figure 7E:
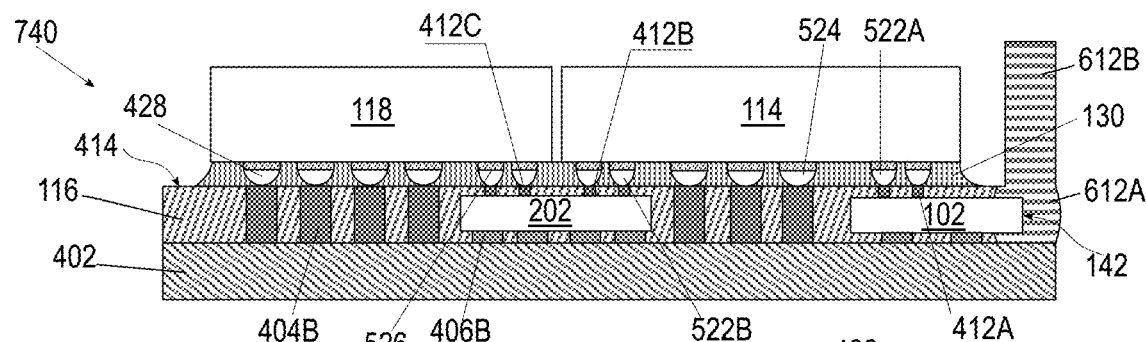

FIG. 7E illustrates an assembly 740 subsequent to disposing EIC 114 and XPU 118 over surface 414 of interposer 116. EIC 114 may be disposed such that DTD interconnects 522A on EIC 114 may be electrically coupled to PIC 102 through small pillars 412A and associated conductive traces, planes, and pads. DTD interconnects 522B on EIC 114 may be electrically coupled to bridge IC 202 through small pillars 412B and associated conductive traces, planes and pads. DTPS interconnects 524 on EIC 114 may be electrically coupled with tall pillars 404A through associated conductive traces, planes, and pads.

XPU 118 may be disposed such that DTD interconnects 526 may be electrically coupled to bridge IC 202 through small pillars 412C and associated conductive traces, planes and pads. DTPS interconnects 428 may be electrically coupled to tall pillars 404B through associated conductive traces, planes, and pads. Assembly 720 may be subjected to a solder reflow process during which solder components of interconnects 522A, 522B, 524, 526 and 428 melt and bond with metallization on surface 414, mechanically coupling EIC 114 and XPU 118 to interposer 116. First-level underfill 130 may be dispensed in a space bounded on one side by surfaces of EIC 114 and XPU 118 and on an opposite side by surface 414 of interposer 116.

Figure 7F:
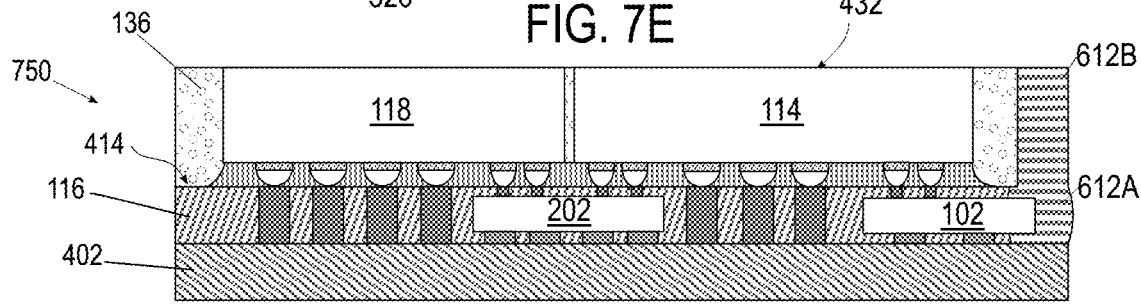

FIG. 7F illustrates an assembly 750 subsequent to a molding process. Mold 136 may be dispensed on interposer 116 and cured or otherwise solidified. A grind back process may allow surface 432 of assembly 750 to be substantially level.

Figure 7G:
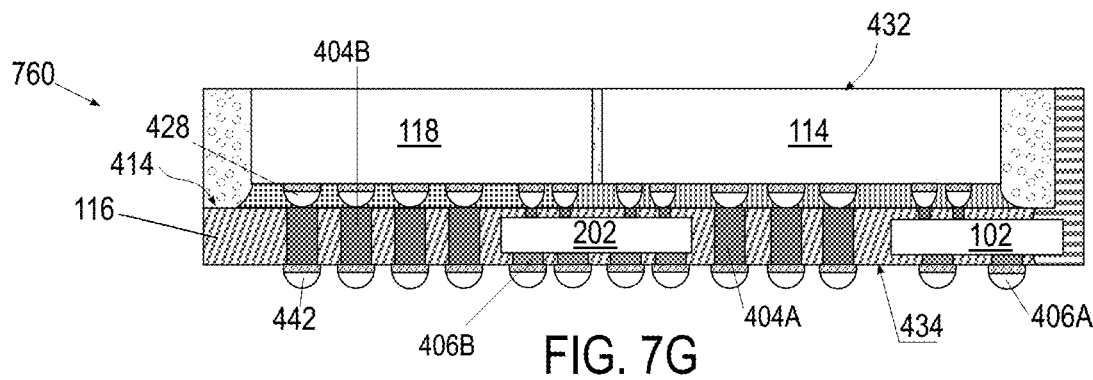

FIG. 7G illustrates an assembly 760 subsequent to attaching interconnects and other operations. Carrier wafer 402 may be separated from assembly 760 using any known process, exposing surface 434 (e.g., "underside") of interposer 116 opposite surface 432. Interconnects 442 and metallization, including pads, traces (not shown) and planes (not shown) may be disposed over surface 434 of interposer 116 using any known process, including electroplating metallization, screen-printing solder, and baking in a solder reflow process. Tall metal pillars 404A, 404B and short metal pillars 406A and 406B and/or conductive traces on surface 434 may enable suitable electrical coupling from PIC 102, EIC 114, XPU 118 and bridge IC 202 to interconnects 442.

Figure 7H:
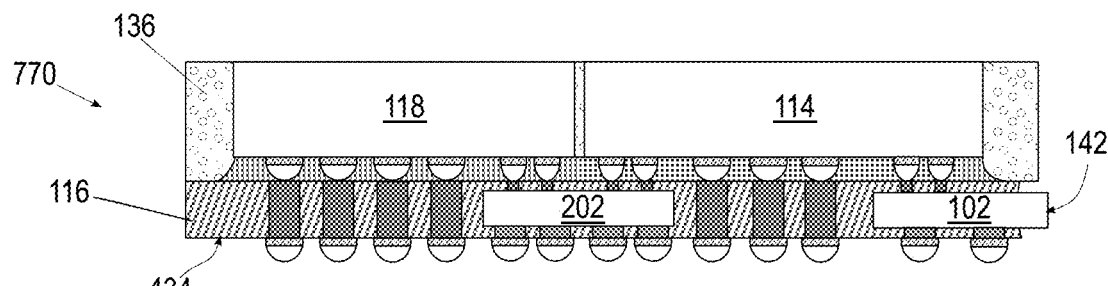

FIG. 7H illustrates an assembly 770 subsequent to a dicing operation in which individual photonic packages are cut and separated. Any suitable dicing process may be used, including scribe dicing, blade dicing, laser dicing, or plasma dicing. Sacrificial material 612A and 612B may be removed using any suitable process according to the type of material used as discussed above. For example, wax may be melted away. Soluble compounds may be dissolved away in an appropriate solvent. In some embodiments, the material may be ablated away. In some embodiments, the material may be peeled off. Removal of sacrificial material 612A and 612B may expose lateral side 142 along with waveguide 110 disposed thereon.

Figure 7I:
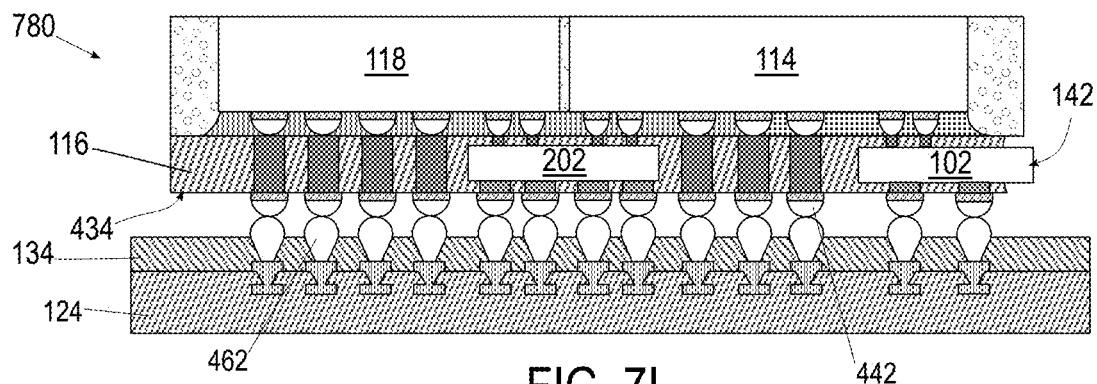

FIG. 7I illustrates an assembly 780 subsequent to disposing over package support 124 such that interconnects 462 on package support 124 are aligned substantially with interconnects 442 on interposer 116. Solder resist 134 may be disposed around interconnects 462 prior to disposing assembly 450 over package support 124. Interconnects 442 on interposer 116 may integrate with interconnects 462 on package support 124 during a solder reflow process, mechanically coupling interposer 116 and associated components to package support 124.

Figure 7J:
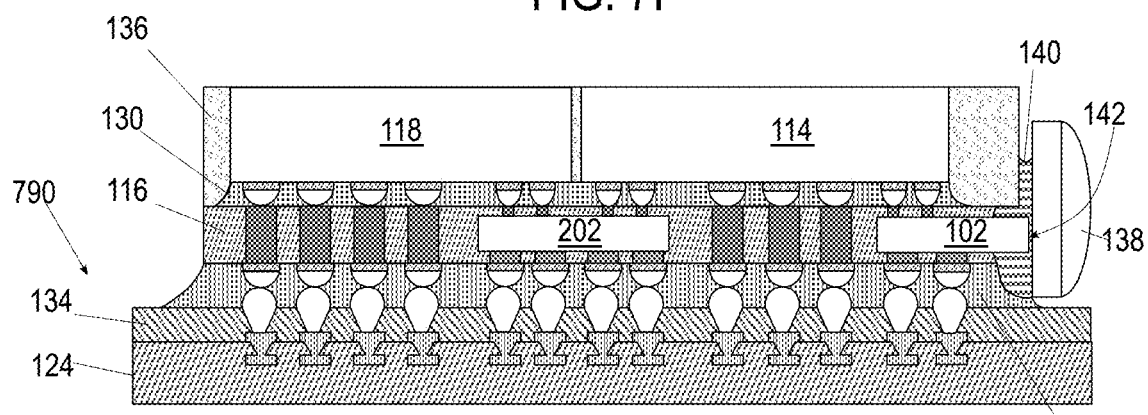

FIG. 7J illustrates an assembly 790 subsequent to attaching optical lens 138 to lateral side 142 using optical glue 140. An amount of optical glue 140 dispensed may be just sufficient to adhere optical lens 138 to PIC 102 in some embodiments; in other embodiments, the amount of optical glue 140 dispensed may be based on other considerations as well, such as mechanical stability and reliability. In some embodiments, optical glue 140 may substantially extend across an entire surface of optical lens 138 proximate to PIC 102. In other embodiments, optical glue 140 may not substantially extend across the entire surface of optical lens 138 proximate to PIC 102. In some embodiments, optical lens 138 may be attached to lateral side 142 before interposer 116 is attached to package support 124; in other embodiments, optical lens 138 may be attached to lateral side 142 after interposer 116 is attached to package support 124 (for example, in embodiments wherein PIC 102 comprises V-grooves and optical lens 138 comprises a corresponding fiber array). Second-level underfill 132 may be disposed between interposer 116 and package support 124. Second-level underfill 132 may be cured according to known processes. In various embodiments, second-level underfill 132 may be disposed over solder resist 134 and may fill interstitial gaps between interposer 116 and solder resist 134. second-level underfill 132 may form a fillet under optical lens 138 depending at least on the position of optical lens 138 relative to package support 124.

Various photonic packages as disclosed herein may be manufactured using any suitable techniques. For example, in some implementations, a choice of fabrication processes may depend on how PIC 102 is coupled to EIC 114 (e.g., using a flip-chip arrangement, or using some other arrangement). In another example, in some implementations, a choice of a technique may depend on the size and position of optical lens 138. In yet other examples, a choice of technique may depend on ease of processing and availability of various materials.

Figure 8:
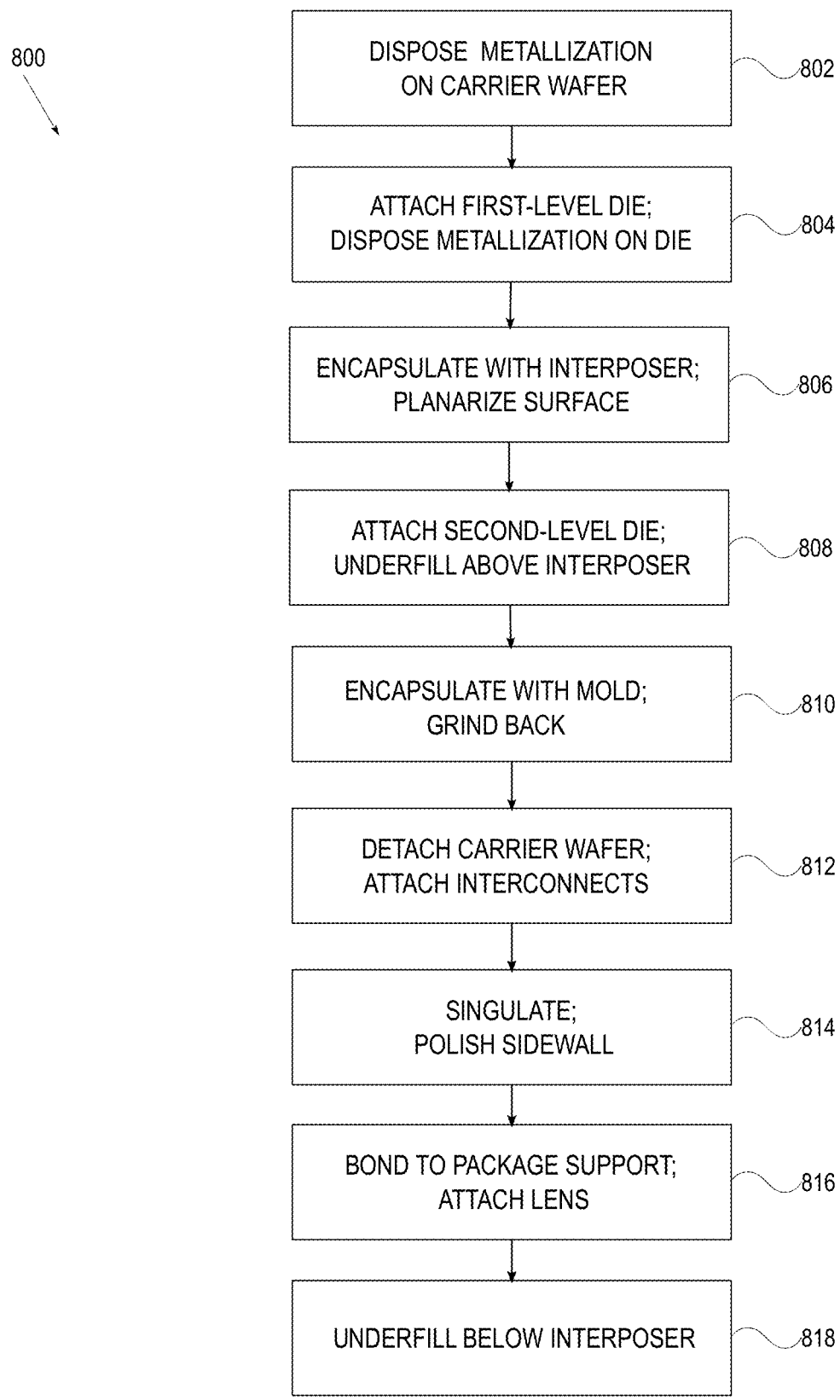
FIG. 8 is a flow diagram of an example method of fabricating a photonic package, according to various embodiments of the present disclosure.

FIG. 8 is a flow diagram of an example method 800 of fabricating photonic package 100, according to various embodiments of the present disclosure. At 802, metallization may be disposed over carrier wafer 402 to generate tall pillars 404 and short pillars 406. Any suitable process may be used for disposing metallization, including electroplating and etching.

At 804, a first-level die may be attached to the metallized carrier wafer 402. As used herein, the term "die" refers to an electrical and/or photonic device embodied in a semiconductor or similar substrate. In some embodiments, as in FIG. 1, the first-level die may comprise EIC 114. In some embodiments as in FIG. 2, the first-level die may comprise bridge IC 202 and PIC 102. In some embodiments as in FIG. 3, the first-level die may comprise PIC 102. The attachment may include disposing the first-level die over the metallized carrier wafer 402 such that pads and traces are aligned to enable electrical coupling to tall pillars 404 and short pillars 406 as appropriate. Additional metallization, such as small pillars 412 may be disposed over the first-level die.

At 806, interposer 116 may be disposed over carrier wafer 402 using any suitable method such that the material of interposer 116 encapsulates the first-level die and the metallization. Surface 414 (e.g., "topside") of interposer 116 may be planarized using CMP or any other suitable process.

At 808, a second-level die may be attached on surface 414 of interposer 116. In some embodiments, as in FIG. 1A, the second-level die may comprise PIC 102 and XPU 118. In some embodiments, as in FIG. 2, the second-level die may comprise EIC 114 and XPU 118. In some embodiments as in FIG. 3, the second-level die may comprise XPU 118. In some embodiments, attachment may comprise disposing the second-level die such that appropriate interconnects are aligned with pads and traces to enable electrical coupling to the first-level die through small pillars 412 and appropriate interconnects are aligned with pads and traces to enable electrical coupling through tall pillars 404. First-level underfill 130 may be disposed between the second-level die and interposer 116. The underfill process may include dispensing underfill material in liquid form, allowing the material to flow and fill interstitial gaps between the second-level die and interposer 116, and subjecting the assembly to a curing process, such as baking, to solidify the material.

At 810, mold encapsulation is performed. Mold is disposed around the components on interposer 116 and solidified appropriately. A grinding (also called grind back) process may substantially planarize and/or smooth surface 432 (e.g., "topside") of the assembly, for example, to enable attaching a heat sink or other component as appropriate.

At 812, carrier wafer 402 may be detached using any suitable process. Detaching carrier wafer 402 may expose surface 434 on interposer 116 opposite surface 414. Interconnects 442 may be attached to surface 434 such that electrical coupling to tall pillars 406 and short pillars 406 is enabled, for example through other metallization such as pads, planes, traces and vias as appropriate. In some embodiments, the attachment may include dispensing solder paste on pads, attaching solder balls, and subjecting the assembly to a solder reflow process, causing the interconnects to integrate with metallization on surface 434 of interposer 116.

At 814, the assembly may be singulated (e.g., cut) into separate and individual packages. A sidewall of the singulated package proximate to PIC 102 may be polished, for example, to expose lateral side 142 and optical structures, including waveguide 110 of PIC 102.

At 816, interposer 116 and associated components may be bonded to package support 124. In various embodiments, the bonding may include disposing interposer 116 over package support 124 such that interconnects 442 on interposer 116 substantially align with interconnects 462 on package support 124. The assembly may be subjected to solder reflow operations, during which interconnects 442 and 462 merge to mechanically couple interposer 116 to package support 124. Optical lens 138 may be attached to lateral side 142 of PIC 102 using optical glue 140.

At 818, second-level underfill 132 may be disposed between the interposer 116 and package support 124. The underfill process may include dispensing underfill material in liquid form, allowing the material to flow and fill interstitial gaps between interposer 116 and package support 124, including under optical lens 138 as appropriate, and subjecting the assembly to a curing process, such as baking, to solidify the material.

Figure 9:
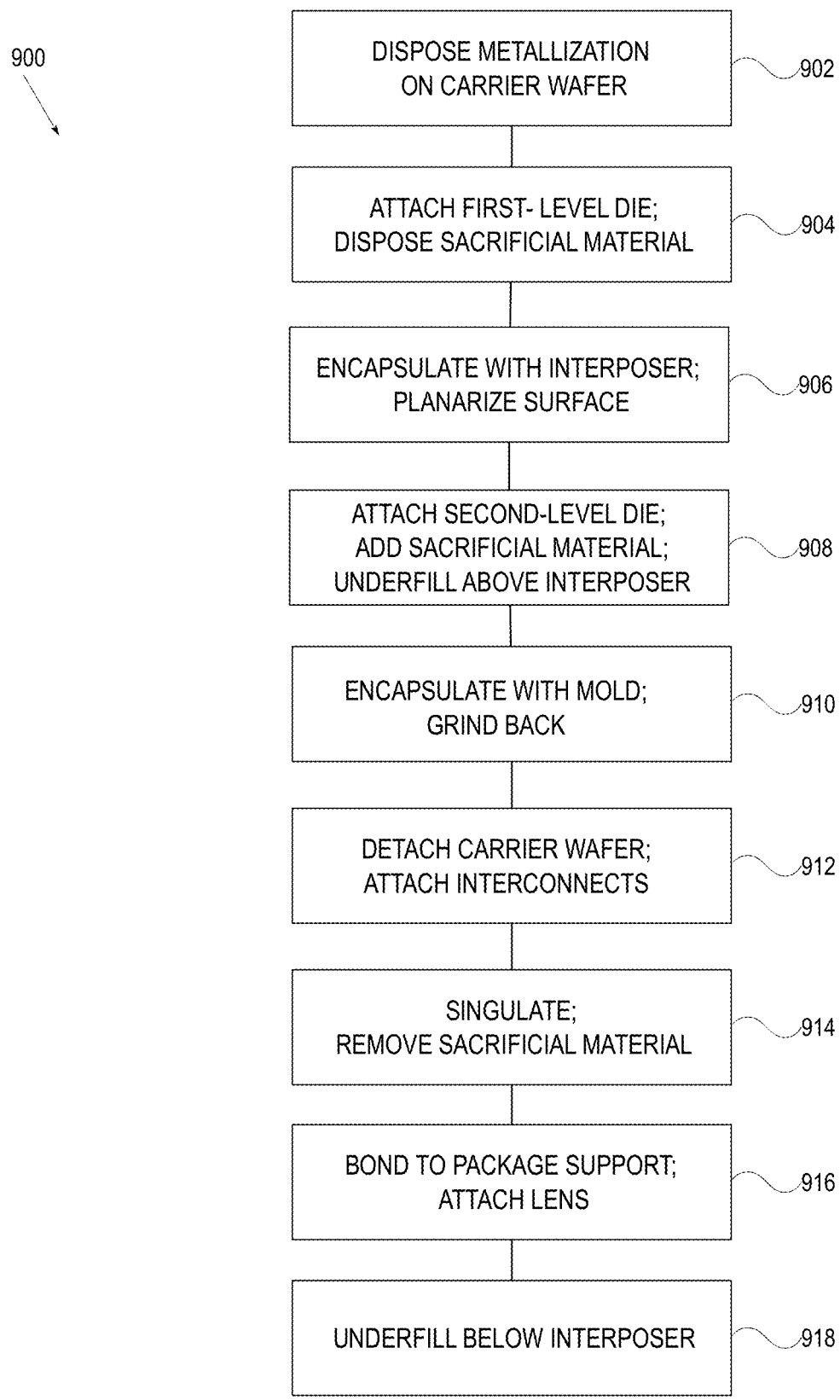
FIG. 9 is a flow diagram of another example method of fabricating a photonic package, according to various embodiments of the present disclosure.

FIG. 9 is a flow diagram of an example method 900 of fabricating photonic package 100, according to various embodiments of the present disclosure. At 902, metallization may be disposed over carrier wafer 402 to generate tall pillars 404 and short pillars 406. Any suitable process may be used for disposing metallization, including electroplating and etching.

At 904, a first-level die may be attached to the metallized carrier wafer 402. In some embodiments, as in FIG. 1, the first-level die may comprise EIC 114. In some embodiments as in FIG. 2, the first-level die may comprise bridge IC 202 and PIC 102. In some embodiments as in FIG. 3, the first-level die may comprise PIC 102. The attachment may include disposing the first-level die over the metallized carrier wafer 402 such that pads and traces are aligned to enable electrical coupling to tall pillars 404 and short pillars 406 as appropriate. Additional metallization, such as small pillars 412 may be disposed over the first-level die. Sacrificial material 162 may be disposed over carrier wafer 402 proximate to a location where PIC 102 may be disposed. In some embodiments, as in FIG. 1A, sacrificial material 612A may be disposed approximately near the location where PIC 102 is to be situated in a subsequent operation. In some embodiments, as in FIGS. 2 and 3, sacrificial material 612A may be disposed around lateral side 142 of PIC 102.

At 906, interposer 116 may be disposed over carrier wafer 402 using any suitable method such that the material of interposer 116 encapsulates the first-level die, the metallization and sacrificial material 612 as appropriate. Surface 414 (e.g., "topside") of interposer 116 may be planarized using CMP or any other suitable process.

At 908, a second-level die may be attached on surface 414 of interposer 116. In some embodiments, as in FIG. 1A, the second-level die may comprise PIC 102 and XPU 118. In some embodiments, as in FIG. 2, the second-level die may comprise EIC 114 and XPU 118. In some embodiments as in FIG. 3, the second-level die may comprise XPU 118. In some embodiments, attachment may comprise disposing the second-level die such that appropriate interconnects are aligned with pads and traces to enable electrical coupling to the first-level die through small pillars 412 and appropriate interconnects are aligned with pads and traces to enable electrical coupling through tall pillars 404.

In some embodiments, additional sacrificial material 6126 may be disposed over surface 414 of interposer 116. In some embodiments, for example, as in FIG. 1A, additional sacrificial material 6126 may be disposed around lateral side 142 of PIC 102. In some embodiments, as in FIGS. 2 and 3, additional sacrificial material 6126 may be disposed over previously disposed sacrificial material 612A.

First-level underfill 130 may be disposed between the second-level die and interposer 116. The underfill process may include dispensing underfill material in liquid form, allowing the material to flow and fill interstitial gaps between the second-level die and interposer 116, and subjecting the assembly to a curing process, such as baking, to solidify the material.

At 910, mold encapsulation is performed. A grind back process may substantially planarize and/or smooth surface 432 (e.g., "topside") of the assembly, for example, to enable attaching a heat sink or other component as appropriate.

At 912, carrier wafer 402 may be detached using any suitable process. Detaching carrier wafer 402 may expose surface 434 on interposer 116 opposite surface 414. Interconnects 442 may be attached to surface 434 such that electrical coupling to tall pillars 406 and short pillars 406 is enabled, for example through other metallization such as pads, planes, traces and vias as appropriate. In some embodiments, the attachment may include dispensing solder paste on pads, attaching solder balls, and subjecting the assembly to a solder reflow process, causing the interconnects to integrate with metallization on surface 434 of interposer 116.

At 914, the assembly may be singulated (e.g., cut) into separate and individual packages. Sacrificial material 612A and 612b may be removed to expose lateral side 142 and associated waveguides 110 of PIC 102.

At 916, interposer 116 and associated components may be bonded to package support 124. In various embodiments, the bonding may include disposing interposer 116 over package support 124 such that interconnects 442 on interposer 116 substantially align with interconnects 462 on package support 124. The assembly may be subjected to solder reflow operations, during which interconnects 442 and 462 merge to mechanically couple interposer 116 to package support 124. Optical lens 138 may be attached to lateral side 142 of PIC 102 using optical glue 140.

At 918, second-level underfill 132 may be disposed between the interposer 116 and package support 124. The underfill process may include dispensing underfill material in liquid form, allowing the material to flow and fill interstitial gaps between interposer 116 and package support 124, including under optical lens 138 as appropriate, and subjecting the assembly to a curing process, such as baking, to solidify the material.

Although the operations of the methods 800 and 900 are illustrated in FIGS. 8 and 9 once each and in a particular order, the operations may be performed in any suitable order and repeated as desired. For example, one or more operations may be performed in parallel to manufacture multiple photonic packages substantially simultaneously. In another example, the operations may be performed in a different order to reflect the structure of a particular photonic package in which one or more PIC 100 as described herein may be included.

Furthermore, the operations illustrated in FIGS. 8 and 9 may be combined or may include more details than described. Still further, methods 800 and 900 shown in FIGS. 8 and 9 may further include other manufacturing operations related to fabrication of other components of the optical receiver assemblies described herein, or any devices that may include optical receiver assemblies as described herein. For example, methods 800 and 900 may include various cleaning operations, surface planarization operations (e.g., using CMP), operations for surface roughening, operations to include barrier and/or adhesion layers as desired, and/or operations for incorporating photonic packages as described herein in, or with, an IC component, a computing device, or any desired structure or device.

Example Devices and Components

Figure 10:
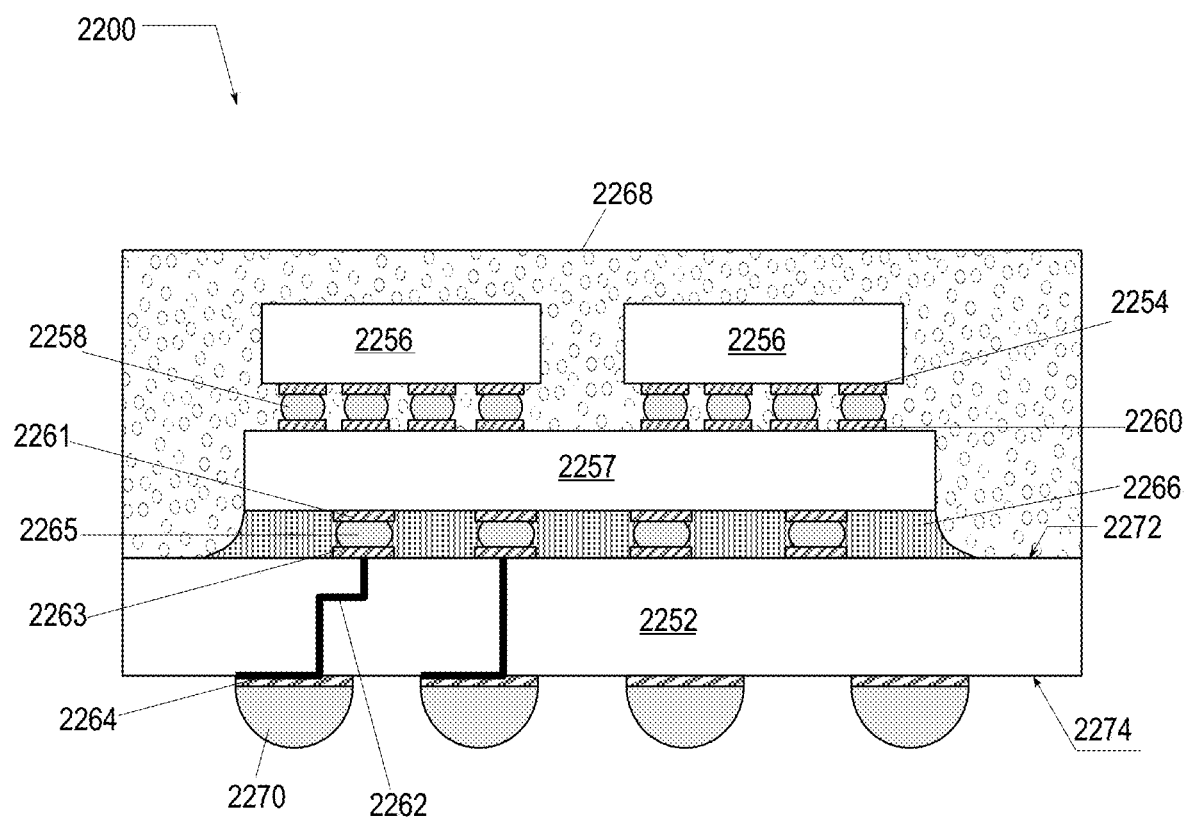
FIG. 10 is a cross-sectional view of a device package that may include one or more photonic packages in accordance with any of the embodiments disclosed herein.
Figure 11:
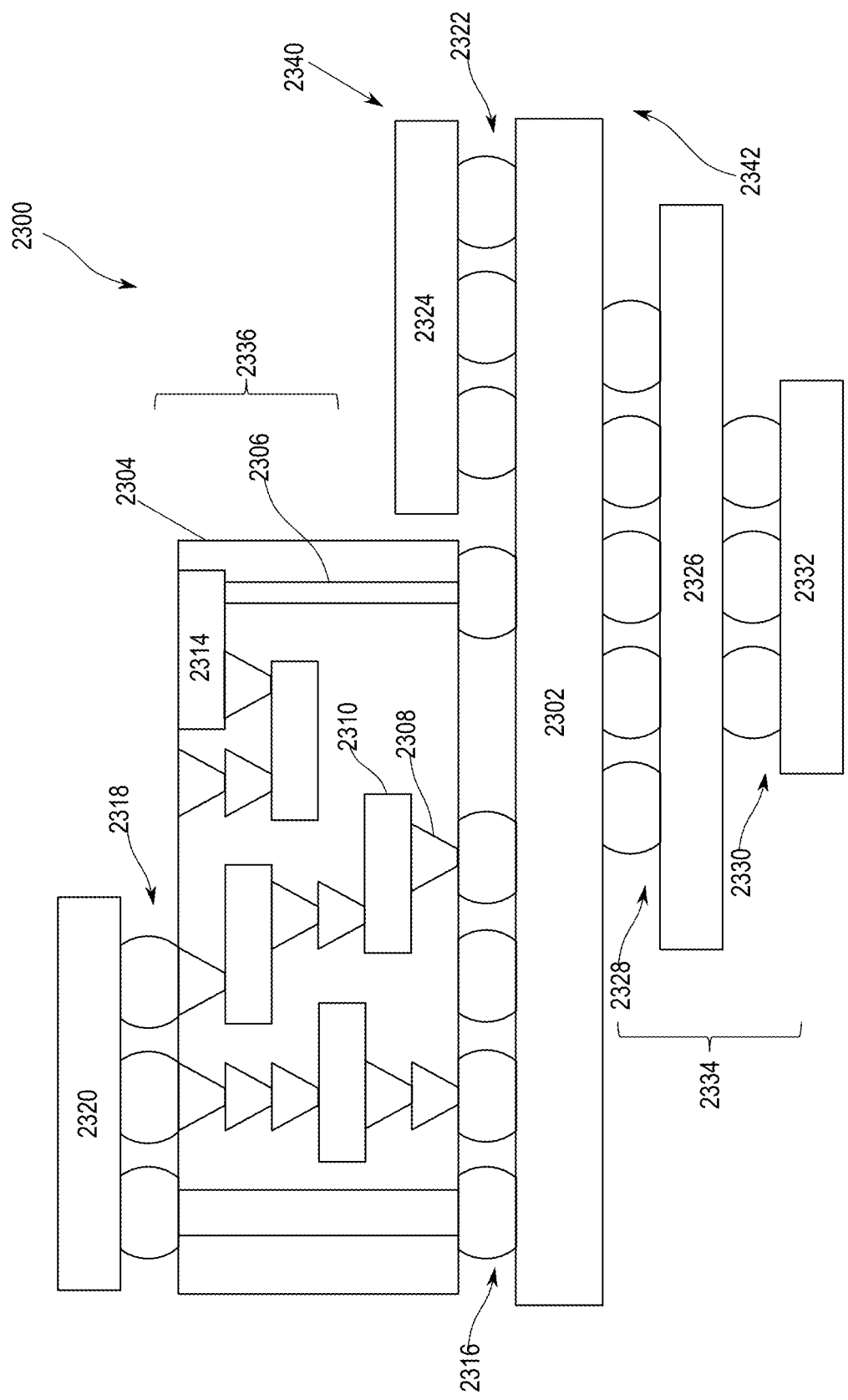
FIG. 11 is a cross-sectional side view of a device assembly that may include one or more photonic packages in accordance with any of the embodiments disclosed herein.
Figure 12:
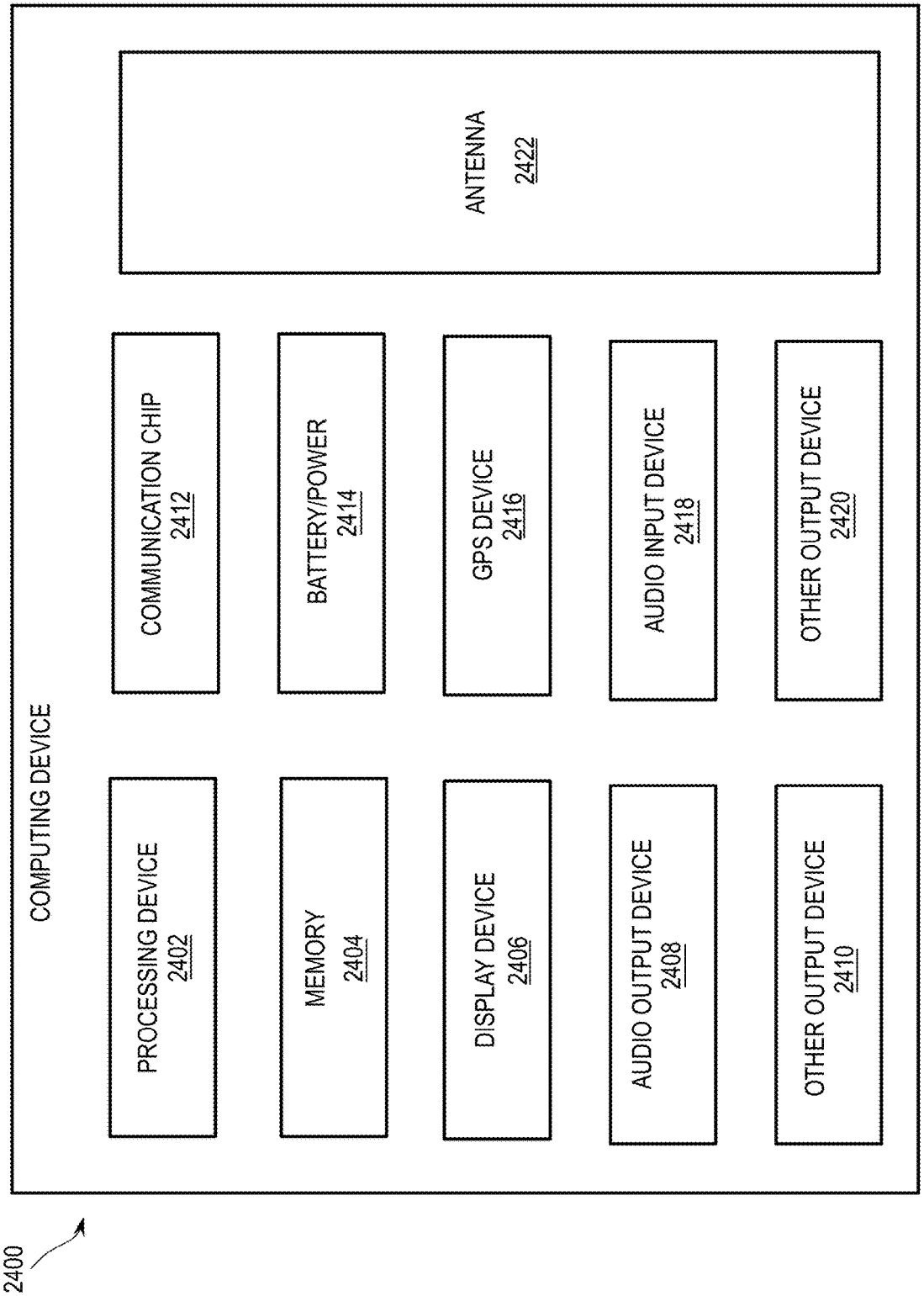
FIG. 12 is a block diagram of an example computing device that may include one or more photonic packages in accordance with any of the embodiments disclosed herein.

The photonic packages disclosed herein, e.g., any of the embodiments shown in FIGS. 1A-3 or any further embodiments described herein, may be included in any suitable electronic/photonic component. FIGS. 10-12 illustrate various examples of packages, assemblies, and devices that may be used with or include any of the photonic packages as disclosed herein.

FIG. 10 is a side, cross-sectional view of an example IC package 2200 that may include photonic packages in accordance with any of the embodiments disclosed herein. In some embodiments, the IC package 2200 may be a system-in-package (SiP).

As shown in FIG. 10, package support 2252 may be formed of an insulating material (e.g., a ceramic, a buildup film, an epoxy film having filler particles therein, etc.), and may have conductive pathways extending through the insulating material between first face 2272 and second face 2274, or between different locations on first face 2272, and/or between different locations on second face 2274. These conductive pathways may take the form of any of the interconnect structures comprising lines and/or vias, e.g., as discussed above with reference to FIG. 1A.

Package support 2252 may include conductive contacts 2263 that are coupled to conductive pathways 2262 through package support 2252, allowing circuitry within dies 2256 and/or interposer 2257 to electrically couple to various ones of conductive contacts 2264 (or to other devices included in package support 2252, not shown).

IC package 2200 may include interposer 2257 coupled to package support 2252 via conductive contacts 2261 of interposer 2257, first-level interconnects 2265, and conductive contacts 2263 of package support 2252. First-level interconnects 2265 illustrated in FIG. 10 are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in FIG. 10 are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package support 2252 and interposer 2257 around first-level interconnects 2265, and mold 2268 may be disposed around dies 2256 and interposer 2257 and in contact with package support 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in FIG. 10 are solder balls (e.g., for a BGA arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 11.

In various embodiments, any of dies 2256 may include PIC 102 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being PIC 102 as described herein, one or more of dies 2256 may be logic dies (e.g., silicon-based dies), one or more of dies 2256 may be memory dies (e.g., high bandwidth memory), etc. In some embodiments, any of dies 2256 which are implemented as PIC 102 may be attached to one or more optical lens 138, e.g., as discussed with reference to FIGS.

1-3 (for example, in a plane out of the paper). In some embodiments, at least some of dies 2256 may not include PIC 102 as described herein.

Although IC package 2200 illustrated in FIG. 10 is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package support 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 11 is a cross-sectional side view of an IC device assembly 2300 that may include components having one or more photonic package 100 with PIC 102 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more photonic package 100 with PIC 102 in accordance with any of the embodiments disclosed herein; e.g., any of the IC packages discussed below with reference to IC device assembly 2300 may take the form of any of the embodiments of IC package 2200 discussed above with reference to FIG. 10.

In some embodiments, circuit board 2302 may be a PCB including multiple metal layers separated from one another by layers of insulating material and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package support.

FIG. 11 illustrates that, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 10. In some embodiments, IC package 2320 may include at least one PIC 102 as described herein. PIC 102 is not specifically shown in FIG. 11 in order to not clutter the drawing.

Although a single IC package 2320 is shown in FIG. 11, multiple IC packages may be coupled to interposer 2304; indeed, additional interposers may be coupled to interposer 2304. Interposer 2304 may provide an intervening package support used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in FIG. 11, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304, for example, as shown in FIGS. 1-3.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 12 is a block diagram of an example computing device 2400 that may include one or more components having one or more photonic packages in accordance with any of the embodiments disclosed herein. For example, any suitable ones of the components of computing device 2400 may include a PIC (e.g., PIC 102 as shown in FIGS. 1-3) having a lens (e.g., lens 138), in accordance with any of the embodiments disclosed herein. In another example, any one or more of the components of computing device 2400 may include any embodiments of IC package 2200 (e.g., as shown in FIG. 10). In yet another example, any one or more of the components of computing device 2400 may include an IC device assembly 2300 (e.g., as shown in FIG. 11).

A number of components are illustrated in FIG. 12 as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single system-on-a-chip (SoC) die.

Additionally, in various embodiments, computing device 2400 may not include one or more of the components illustrated in FIG. 12, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more digital signal processors (DSPs), ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

Select Examples

The following paragraphs provide various examples of the embodiments disclosed herein.

Example 1 provides a photonic package that includes a package support (e.g., 124 shown in FIG. 1A) and a PIC (e.g., 102 shown in FIG. 1A). The package support may have one or more electrical interconnects and bond pads (e.g., 112, 120, 122, 126, 128 shown in FIG. 1A). The PIC has an active side (e.g., 104 shown in FIG. 1A) and a lateral side (e.g., 142 shown in FIG. 1A) substantially perpendicular to the active side. The PIC is electrically coupled to an IC (e.g., EIC 114 shown in FIG. 1A) and to the package support. A substantial portion of the active face of the PIC is in contact with an insulating material (e.g., first-level underfill 130 as shown in FIG. 1A or interposer 116 as shown in FIGS. 2 and 3). An optical lens (e.g., 138 shown in FIG. 1A) is coupled to the lateral side of the PIC. The active side of the PIC includes at least one optical structure (e.g., 110 as shown in FIG. 1B) configured to receive, transform, or transmit optical signals.

Example 2 provides the photonic package according to example 1, where the PIC is electrically coupled to the IC with interconnects (e.g., 112 in FIG. 1A).

Example 3 provides the photonic package according to example 2, where a pitch of the interconnects is between 20 micrometer and 30 micrometer.

Example 4 provides the photonic package according to example 1 or 2, where the interconnects are of a first type, where the PIC is electrically coupled to the package support with interconnects of a second type (e.g., 126 in FIG. 1A).

Example 5 provides the photonic package according to example 4, where a pitch of the interconnects of the first type is less than a pitch of the interconnects of the second type.

Example 6 provides the photonic package according to example 4, where the interconnects of the second type include through-mold vias (e.g., 404A as shown in FIG. 4A, or 406A as shown in FIG. 5A).

Example 7 provides the photonic package according to any one of examples 1-6, where the IC comprises a switching circuit of a communications system.

Example 8 provides the photonic package according to any one of examples 1-6, where the IC comprises a bridge circuit enabling electrical coupling to another IC (e.g., 118 as shown in FIG. 1A).

Example 9 provides the photonic package according to example 8, where the another IC comprises a processor circuit.

Example 10 provides the photonic package according to example 8 or 9, where the another IC is electrically coupled to the package support with interconnects (e.g., 128 as shown in FIG. 1A).

Example 11 provides the photonic package according to any one of examples 1-10, where the IC is electrically coupled to the package support with interconnects of a third type (e.g., 122 as shown in FIG. 1A or 128 as shown in FIG. 3).

Example 12 provides the photonic package according to any one of examples 1-6, where the IC comprises a processor circuit (e.g., as shown in FIG. 3).

Example 13 provides the photonic package according to any one of examples 1-6, where the IC is situated in an interposer (e.g., 116 as shown in FIG. 1A).

Example 14 provides the photonic package according to any one of examples 1-6, where the PIC is situated in the interposer (e.g., 102 as shown in FIG. 2).

Example 15 provides the photonic package according to example 14, where the IC is over the interposer (e.g., 114 as shown in FIG. 2 or 118 as shown in FIG. 3).

Example 16 provides the photonic package according to example 15, further including a bridge circuit (e.g., 202 as shown in FIG. 2) enabling electrical coupling to another IC (e.g., 118 as shown in FIG. 2).

Example 17 provides the photonic package according to any one of examples 1-6, where the optical lens is attached to the lateral side with optical glue.

Example 18 provides the photonic package according to example 17, where the optical glue extends substantially across an area of the optical lens proximate to the lateral side.

Example 19 provides the photonic package according to example 17 or 18, where the optical glue extends beyond the lateral side of the PIC into a side of the underfill (e.g., as shown in FIGS. 1C-1E).

Example 20 provides the photonic package according to any one of examples 17-19, further including an interposer under the underfill, where the optical glue extends beyond the lateral side of the PIC into a side of the interposer (e.g., as shown in FIGS. 1C-1E).

Example 21 provides the photonic package according to any one of examples 17-20, where the optical glue extrudes under the interposer (e.g., as shown in FIG. 1C).

Example 22 provides the photonic package according to any one of examples 17-20, where the optical glue extrudes under the PIC on the lateral side (e.g., as shown in FIGS. 6I and 7J).

Example 23 provides the photonic package according to any one of examples 17-20, where the optical glue extrudes over the PIC on the lateral side (e.g., as shown in FIGS. 6I and 7J).

Example 24 provides the photonic package according to any one of the preceding examples, where the package support is one of a substrate, an interposer, or a circuit board.

Example 25 provides the photonic package according to any one of examples 1-23, where the optical structure includes a waveguide.

Example 26 provides the photonic package according to example 25, where the waveguide includes a de-multiplexer.

Example 27 provides the photonic package according to example 26, where the de-multiplexer is an AWG de-multiplexer, an Echelle grating, a single-mode waveguide, or a TFF de-multiplexer.

Example 28 provides the photonic package according to any one of examples 25-27, where the waveguide is exposed on the lateral side of the PIC.

Example 29 provides the photonic package according to any one of examples 1-28, where the ODI package support is integrated with a FAU.

Example 30 provides the photonic package according to any one of examples 1-29 further coupled an optical fiber in a photonic package assembly, where the optical fiber is configured to communicate optical signals through the optical lens.

Example 31 provides a method of fabricating a photonic package assembly. The method includes providing a carrier wafer and disposing metallization on the carrier wafer.

Example 32 provides the method according to example 31, further including attaching a die on the metallization and adding additional metallization on the die.

Example 33 provides a method according to examples 31 or 32, further including encapsulating at least a portion of the die, the metallization and the additional metallization with an interposer material, and curing the interposer material as part of forming an interposer.

Example 34 provides a method according to any one of examples 31-32, further including planarizing a surface of the interposer.

Example 35 provides a method according to any one of examples 31-34, where the die comprises a first-level die, where the method further includes attaching a second-level die on the planarized surface of the interposer.

Example 36 provides a method according to any one of examples 31-35, further including disposing underfill material between the second-level die and the interposer, and curing the underfill material as part of forming an underfill.

Example 37 provides a method according to any one of examples 31-36, further including encapsulating with a mold, curing the mold as part of forming a mold, and grinding a surface of the mold.

Example 38 provides a method according to any one of examples 31-37, further including exposing a side of the interposer proximate to the carrier wafer, the exposing operation comprising detaching the carrier wafer.

Example 39 provides a method according to any one of examples 31-38, further including attaching interconnects to the exposed side of the interposer.

Example 40 provides a method according to any one of examples 31-39, where any one of the first-level die or the second-level die comprises a PIC having a lateral side, the method further including separating individual photonic packages, the separating comprising dicing through a thickness along a direction substantially parallel to the lateral side, and exposing the lateral side.

Example 41 provides a method according to any one of examples 31-40, further including polishing the lateral side.

Example 42 provides a method according to any one of examples 31-41, further including coupling an optical lens to the lateral side.

Example 43 provides a method according to any one of examples 31-42, further including coupling the interposer to a package support.

Example 44 provides a method according to any one of examples 31-43, further including dispensing another underfill material between the interposer and the package support, and curing the another underfill material as part of forming the another underfill.

Example 45 provides a method according to any one of examples 31-44, further including coupling an optical fiber to the optical lens.

Example 46 provides the method according to any one of examples 31-45, further including processes to provide the photonic package according to any one of examples 1-29.

Example 47 provides a method of fabricating a photonic package assembly. The method includes providing a carrier wafer and disposing metallization over the carrier wafer.

Example 48 provides the method according to example 47, further including attaching a die on the metallization, adding additional metallization on the die and disposing a sacrificial material over the carrier wafer.

Example 49 provides a method according to any one of examples 47 or 48, further including encapsulating at least a portion of the die, the metallization and the additional metallization with an interposer material, and curing the interposer material as part of forming an interposer.

Example 50 provides a method according to any one of examples 47-49, further including planarizing a surface of the interposer.

Example 51 provides a method according to any one of examples 47-50, where the die comprises a first-level die, where the method further includes attaching a second-level die on the planarized surface of the interposer.

Example 52 provides a method according to any one of examples 47-51, further including disposing additional sacrificial material over the planarized surface of the interposer proximate to the previously disposed sacrificial material, disposing underfill material between the second-level die and the interposer, and curing the underfill material as part of forming an underfill.

Example 53 provides a method according to any one of examples 47-52, further including encapsulating with a mold, curing the mold as part of forming a mold, and grinding a surface of the mold.

Example 54 provides a method according to any one of examples 47-52, further including exposing a side of the interposer proximate to the carrier wafer, the exposing operation comprising detaching the carrier wafer.

Example 55 provides a method according to any one of examples 47-53, further including attaching interconnects to the exposed side of the interposer.

Example 56 provides a method according to any one of examples 47-54, where any one of the first-level die or the second-level die comprises a PIC having a lateral side, the method further including separating individual photonic packages, the separating comprising dicing through a thickness along a direction substantially parallel to the lateral side.

Example 57 provides a method according to any one of examples 47-55, further including removing the sacrificial material and the additional sacrificial material as part of exposing the lateral side.

Example 58 provides a method according to any one of examples 47-57, further including coupling an optical lens to the lateral side.

Example 59 provides a method according to any one of examples 47-58, further including coupling the interposer to a package support.

Example 60 provides a method according to any one of examples 47-59, further comprising dispensing another underfill material between the interposer and the package support, and curing the another underfill material as part of forming an another underfill.

Example 61 provides a method according to any one of examples 47-60, further including coupling an optical fiber to the optical lens.

Example 62 provides the method according to any one of examples 47-61, further including processes to provide the photonic package according to any one of examples 1-30.

Example 63 provides a method of fabricating a photonic package assembly (e.g., 100 in FIG. 1A), including providing an interposer (e.g., 116 in FIG. 1A) having a first side (e.g., 414), a second side opposite to the first side (e.g., 434), and a lateral side substantially perpendicular to the first side and the second side; disposing a first-level die (e.g., 114 in FIG. 1A, 102 in FIGS. 2 and 3) in the interposer; disposing a second-level die (e.g., 102 in FIG. 1A, 114 in FIG. 2, 118 in FIG. 3) proximate to the first side of the interposer; providing electrical coupling between the first-level die and the second-level die with interconnects of a first type (e.g., 112); exposing at least one optical structure (e.g., 110) on the first-level die or the second-level die proximate to the lateral side of the interposer; and coupling an optical lens (e.g., 138) to the optical structure.

Example 64 provides the method according to example 62, where exposing the at least one optical structure comprises polishing the lateral side.

Example 65 provides the method according to example 62, further comprising disposing a sacrificial material (e.g., 612) over the first side of the interposer proximate to the lateral side, where exposing the at least one optical structure comprises removing the sacrificial material.

Example 66 provides the method according to any one of examples 62-64, further comprising disposing an underfill (e.g., 130) between the second-level die and the first side of the interposer.

Example 67 provides the method according to any one of examples 62-65, further comprising coupling the interposer to a package support (e.g., 124) proximate to the second side, and disposing another underfill (e.g., 132) between the package support and the second side of the interposer.

Example 68 provides a photonic integrated circuit (PIC) having an active side with at least one optical structure, where a substantial portion of the active side is in contact with an insulating material; and a lateral side coupled to an optical lens, the lateral side being substantially perpendicular to the active side.

Example 69 provides the PIC according to example 68, where the insulating material comprises an interposer material or an underfill material.

Example 70 provides the PIC according to any of examples 68-69, where the PIC is electrically coupled to an IC by interconnects of a first type and to a package substrate by interconnects of a second type, where a first pitch of the interconnects of the first type is smaller than a second pitch of the interconnects of the second type.

Example 71 provides the PIC according to any of examples 68-70, where the optical lens is attached to the lateral side with optical glue.

Example 72 provides the PIC according to any of examples 68-71, where the PIC further comprises V-grooves on the active side exposed on the lateral side and the optical lens comprises a fiber array self-aligned to the V-grooves.

Example 73 provides the PIC according to any of examples 68-72, where the PIC further comprises optical epoxy on the active side.

Example 74 provides the PIC according to any of examples 68-73, where a heat sink is coupled on the PIC opposite to the active side.

Example 75 provides the PIC according to any of examples 68-74, where the optical lens protrudes beyond a side of the PIC opposite to the active side, and a heat sink coupled on the PIC opposite to the active side comprises a cutout that accommodates the protrusion of the optical lens beyond the PIC.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A photonic package, comprising:
   a package support;
   an integrated circuit (IC);
   an insulating material;
   an interposer having a first side and a second side opposite to the first side, wherein the package support is proximate to the second side of the interposer, and the IC is within the interposer;
   a photonic IC (PIC) having an active side and a lateral side substantially perpendicular to the active side, wherein:
      the PIC is proximate to the first side of the interposer,
      the insulating material is between the PIC and the first side of the interposer,
      at least one optical structure is on the active side,
      a portion of the active side is in contact with the insulating material, and
      the PIC is electrically coupled to the package support and to the IC; and
   an optical lens coupled to the PIC on the lateral side.

2. The photonic package of claim 1, wherein the PIC is electrically coupled to the IC with interconnects.

3. The photonic package of claim 2, wherein a pitch of the interconnects is between 20 micrometer and 30 micrometer.

4. The photonic package of claim 2, wherein the interconnects are of a first type, wherein the PIC is electrically coupled to the package support with interconnects of a second type.

5. The photonic package of claim 4, wherein a pitch of the interconnects of the first type is less than a pitch of the interconnects of the second type.

6. The photonic package of claim 1, further comprising another IC, wherein the IC comprises a bridge circuit enabling electrical coupling to the another IC.

7. The photonic package of claim 6, wherein the another IC comprises a processor circuit.

8. The photonic package of claim 1, wherein the insulating material comprises an underfill between the PIC and the first side of the interposer.

9. The photonic package of claim 1, further comprising another IC, wherein:

the another IC is proximate to the first side of the interposer, and the another IC is electrically coupled to the package support and to the IC.

10. The photonic package of claim 1, wherein the portion of the active side that is in contact with the insulating material is a substantial portion of the active side.

11. The photonic package of claim 1, wherein a surface of the optical lens closest to the lateral side of the PIC is substantially flat.

12. The photonic package of claim 1, wherein the optical lens is coupled to the lateral side with optical glue.

13. The photonic package of claim 1, wherein, in a cross-section of the photonic package in a plane substantially perpendicular to the package support, a portion of the optical lens is in a single plane with a portion of the interposer.

14. A photonic integrated circuit (PIC) comprising:
an active side having at least one optical structure, wherein at least about 90 percent of the active side is in contact with an insulating material; and
a lateral side coupled to an optical lens, wherein the lateral side is substantially perpendicular to the active side, wherein the PIC is electrically coupled to an integrated circuit (IC) by interconnects of a first type and to a package substrate by interconnects of a second type.

15. The PIC of claim 14, wherein the insulating material comprises an interposer material or an underfill material.

16. A method of fabricating a photonic package assembly, comprising:

providing an interposer having a first side, a second side opposite to the first side, and a lateral side substantially perpendicular to the first side and the second side;
disposing a first-level die in the interposer;
disposing a second-level die proximate to the first side of the interposer;
providing electrical coupling between the first-level die and the second-level die with interconnects of a first type;
exposing at least one optical structure on the first-level die or the second-level die proximate to the lateral side of the interposer; and
coupling an optical lens to the at least one optical structure.

17. The method of claim 16, wherein exposing the at least one optical structure comprises polishing the lateral side.

18. The method of claim 16, further comprising disposing a sacrificial material over the first side of the interposer proximate to the lateral side, wherein exposing the at least one optical structure comprises removing at least a portion of the sacrificial material.

19. The method of claim 16, further comprising disposing an underfill between the second-level die and the first side of the interposer.

20. The method of claim 19, further comprising:
coupling the interposer to a package support proximate to the second side; and
disposing another underfill between the package support and the second side of the interposer.

* * * * *